(12) United States Patent
Miyairi et al.

(10) Patent No.: US 7,638,378 B2
(45) Date of Patent: Dec. 29, 2009

(54) METHOD FOR FORMING SEMICONDUCTOR DEVICE

(75) Inventors: Hidekazu Miyairi, Isehara, Kanagawa (JP); Sho Kato, Isehara, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 113 days.

(21) Appl. No.: 12/033,637

(22) Filed: Feb. 19, 2008

(65) Prior Publication Data

US 2008/0206967 A1 Aug. 28, 2008

(30) Foreign Application Priority Data

Feb. 23, 2007 (JP) ............................. 2007-044044

(51) Int. Cl.
*H01L 21/00* (2006.01)
(52) U.S. Cl. ........................ 438/166; 438/308; 438/486; 257/E21.347; 257/E21.475; 257/E21.596
(58) Field of Classification Search ................. 438/149, 438/151, 166, 308, 378, 486, 487, 795; 257/E21.211, 257/E21.328, E21.347, E21.475, E21.596
See application file for complete search history.

(56) References Cited

U.S. PATENT DOCUMENTS

| 5,312,771 | A | 5/1994 | Yonehara |
| 6,818,485 | B2 * | 11/2004 | Morosawa ................. 438/151 |
| 7,132,375 | B2 | 11/2006 | Yamazaki |
| 2004/0053452 | A1 | 3/2004 | Hasegawa et al. |
| 2007/0087488 | A1 | 4/2007 | Moriwaka |
| 2007/0222038 | A1 | 9/2007 | Moriwaka |

FOREIGN PATENT DOCUMENTS

| JP | 4-212410 | 8/1992 |
| JP | 2003-168646 | 6/2003 |
| JP | 2003-178979 | 6/2003 |
| JP | 2004-134773 | 4/2004 |

OTHER PUBLICATIONS

Ide et al., "High-Mobility TFT on Large Glass Substrate Using Indirect Heating Method", AM-LCD, 04, Digest of Technical Papers, Jan. 1, 2004, TFT2-L2, pp. 83-84.
Hasegawa et al., "A Novel Crystallization Method for Silicon Films With a Near-Infrared Laser and Absorption Layer-Zone Melting for Films-", AM-LCD, 03 Digest of Technical Papers, Jan. 1, 2003, TFT2-1, pp. 25-28.
Hara et al., "Selective Single-Crystalline-Silicon Growth at the Predefined Active Regions of TFTS on a Glass by a Scanning DPSS CW Laser Irradiation", Technical Report of IEICE, Apr. 1, 2001, ED2001-10/SDM2001-10, pp. 21-27 with Abstract.
Sugawara et al. "22a-W-8 Crystallization of Double Layer Si Thin Films by Solid Green Laser Annealing", The 53rd Spring Meeting of the Japan Society of Applied Physics and Related Societies Preliminary Drafts, Mar. 22, 2006, No. 2, 22a-W-8, p. 888 (including Full English translation).

(Continued)

*Primary Examiner*—Quoc D Hoang
(74) *Attorney, Agent, or Firm*—Nixon Peabody, LLP; Jeffrey L. Costellia

(57) ABSTRACT

A thin semiconductor film is crystallized in a high yield by being irradiated with laser light. An insulating film, a semiconductor film, an insulating film, and a semiconductor film are stacked in this order over a substrate. Laser light irradiation is performed from above the substrate to melt the semiconductor films of a lower layer and an upper layer, whereby the semiconductor film of the lower layer is crystallized. With the laser light irradiation, the semiconductor film of the upper layer changes to a liquid state, thereby reflecting the laser light and preventing the semiconductor film of the lower layer from being overheated with the laser light. Further, by melting the semiconductor film of the upper layer as well, time for melting the semiconductor film of the lower layer can be extended.

43 Claims, 23 Drawing Sheets

OTHER PUBLICATIONS

Maki et al. "Laser Crystallization of Silicon Films using Optical Absorption Layer of Diamond-Like Carbon 2", The 53$^{rd}$ Spring Meeting of the Japan Society of Applied Physics and Related Societies Preliminary Drafts, Mar. 22, 2006, No. 2, 22a-W-9, p. 888 (including Full English translation).

* cited by examiner

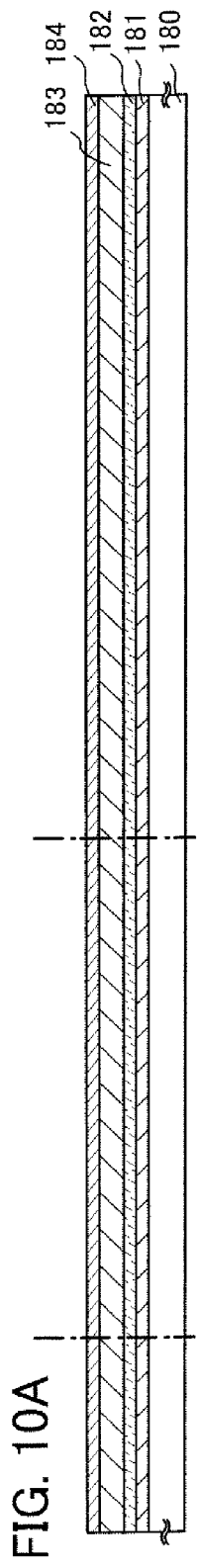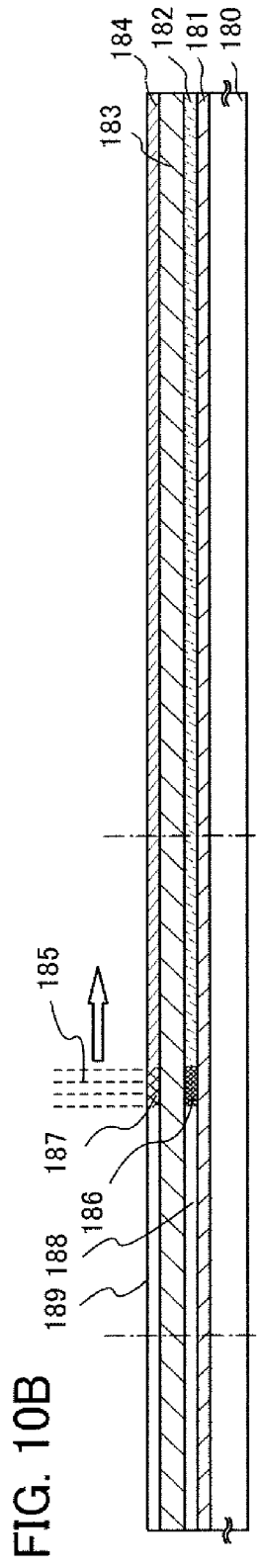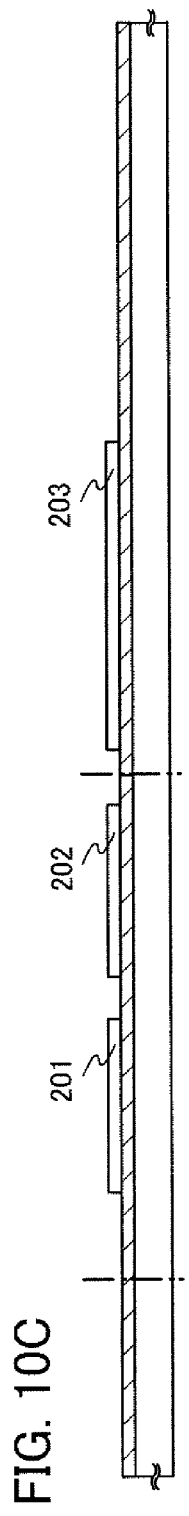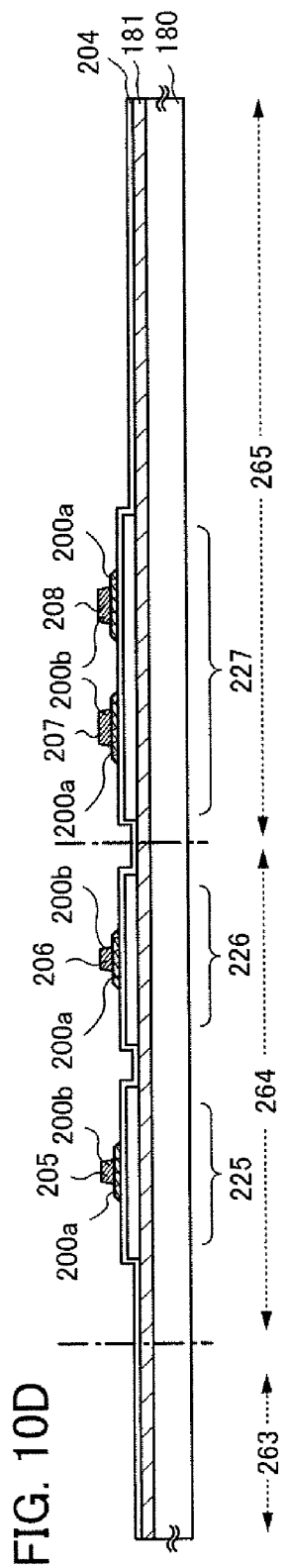

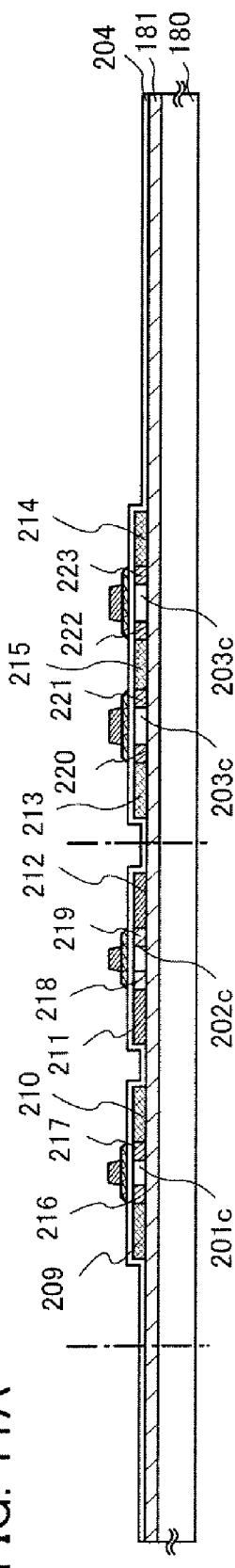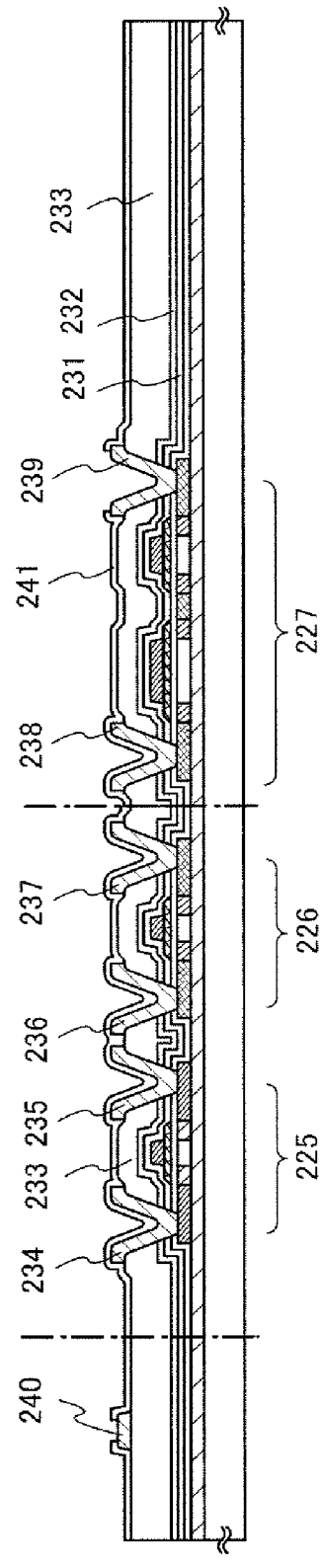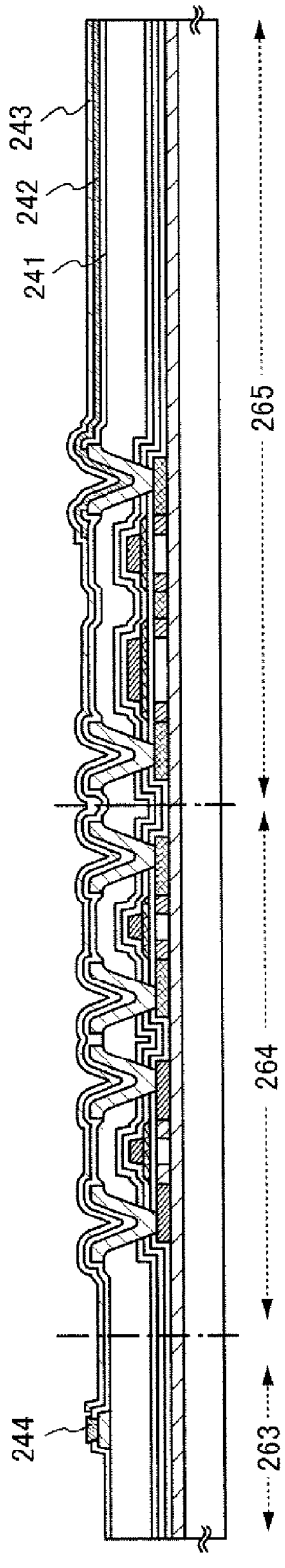

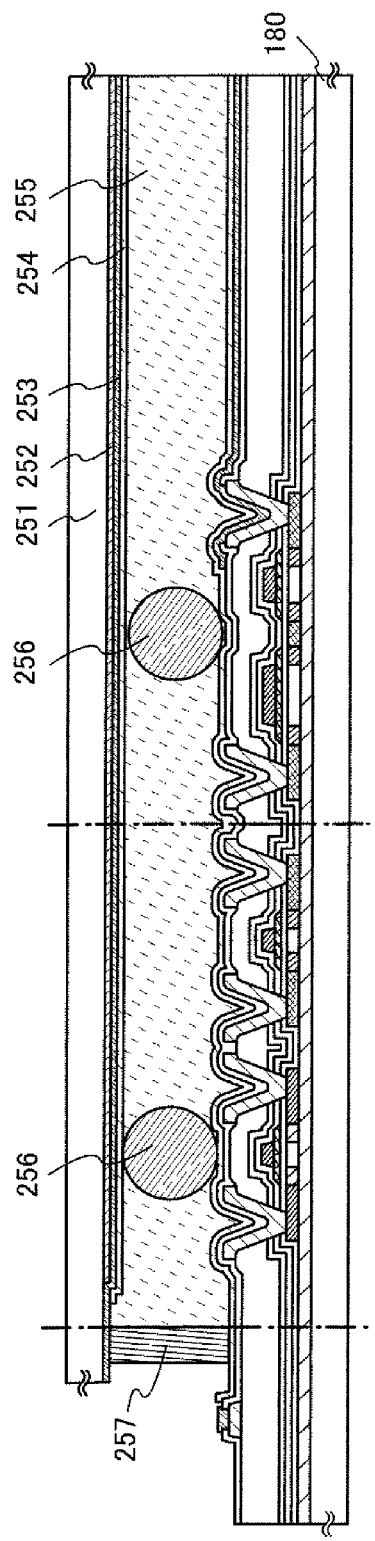
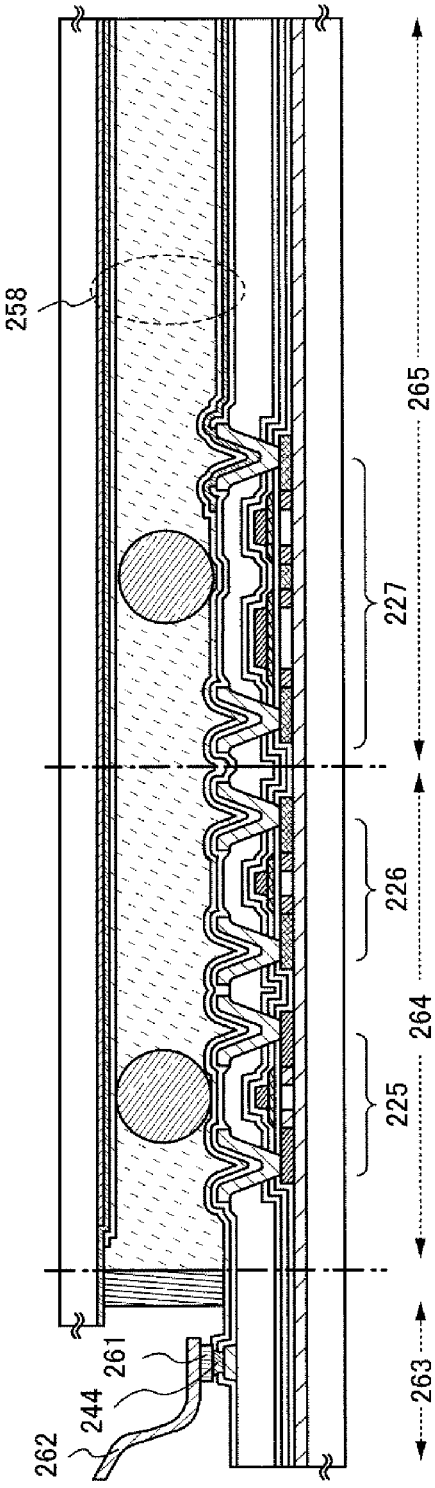

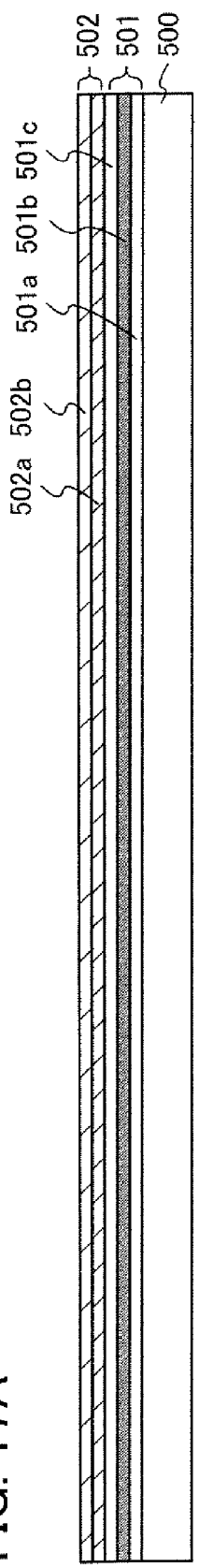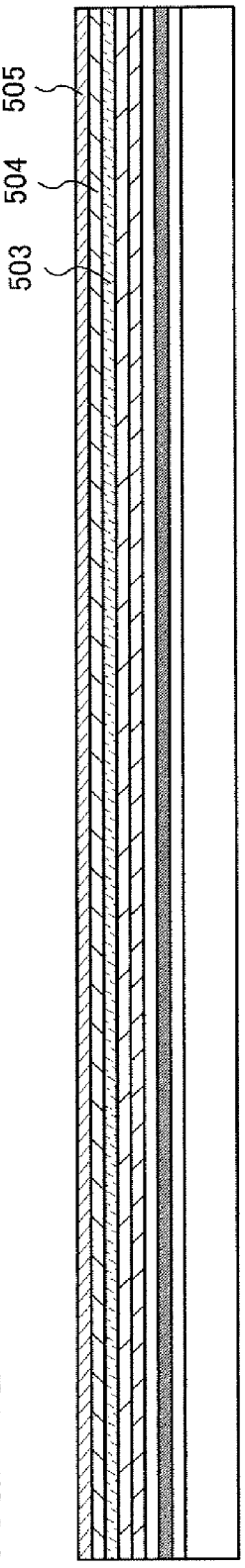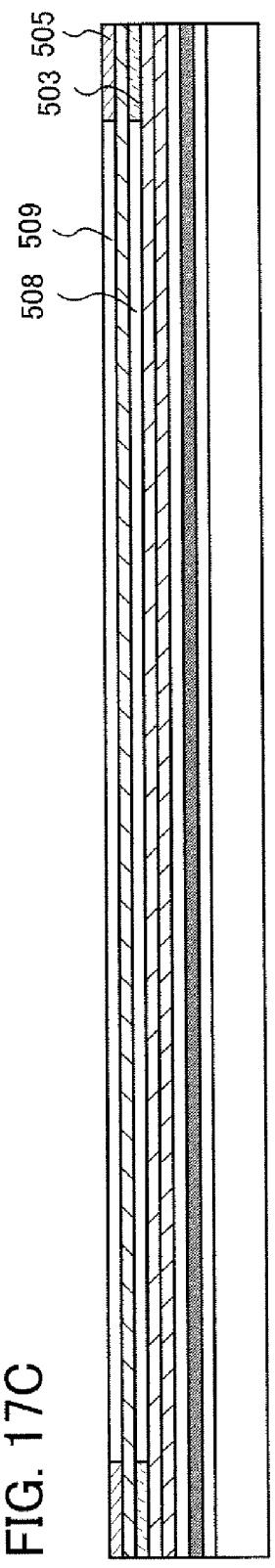
FIG. 17A
FIG. 17B
FIG. 17C

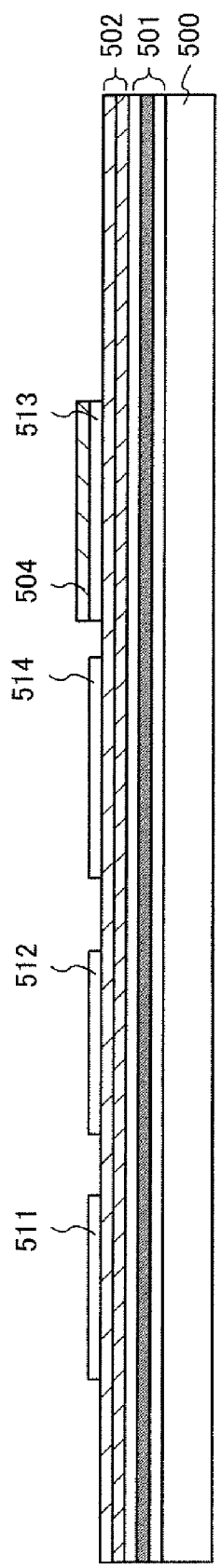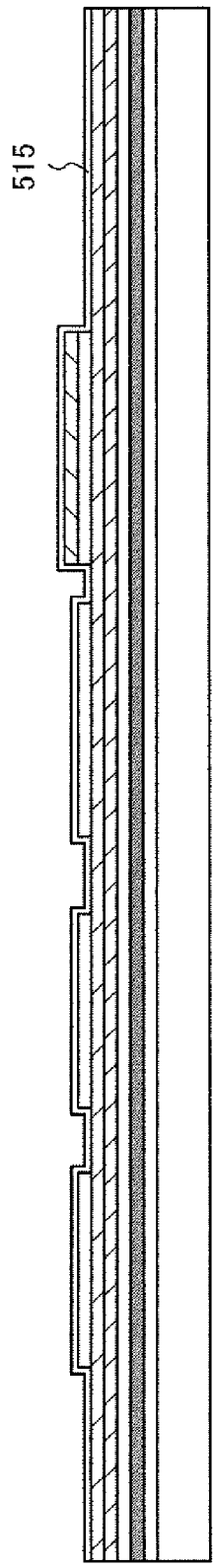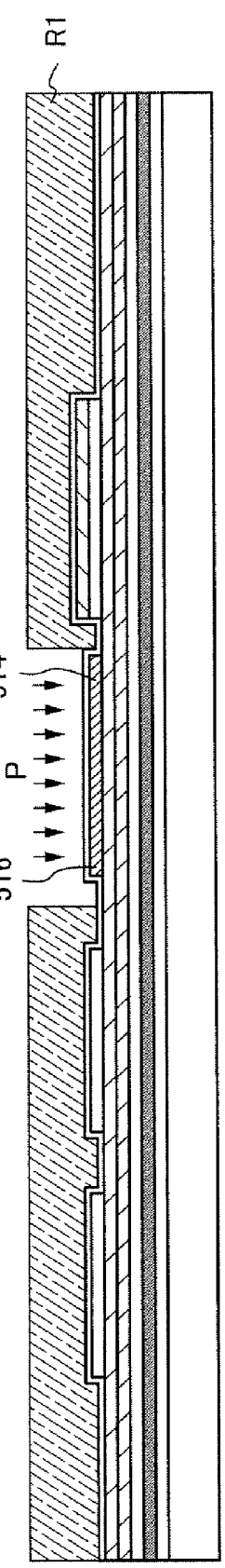

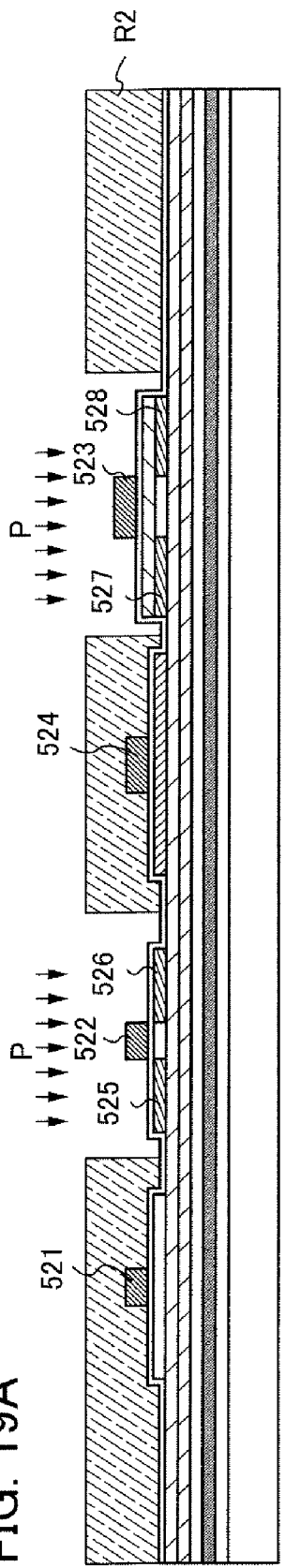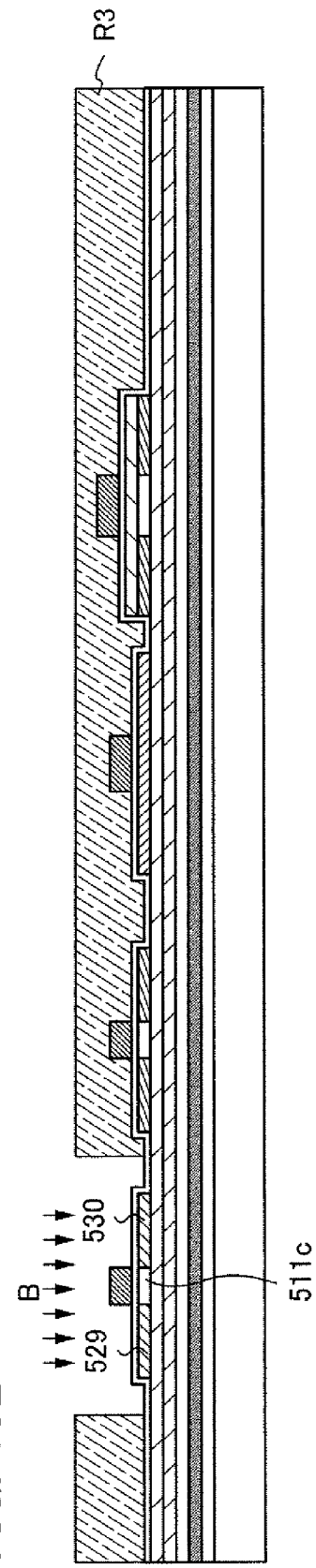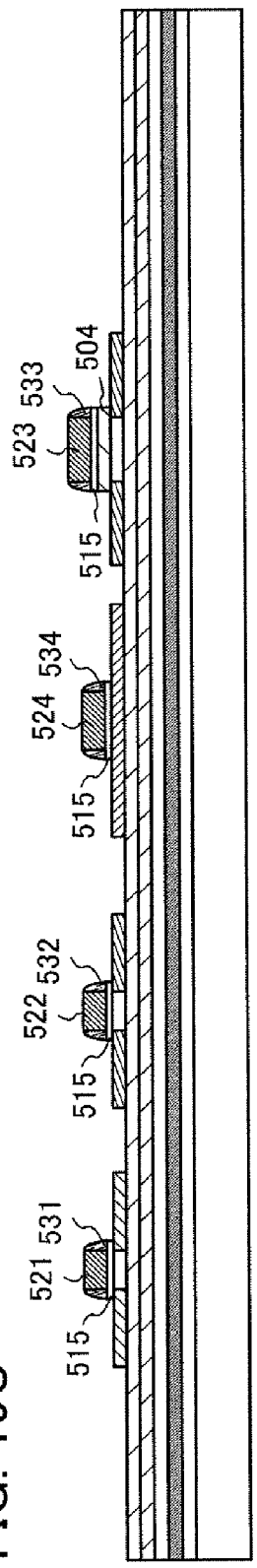

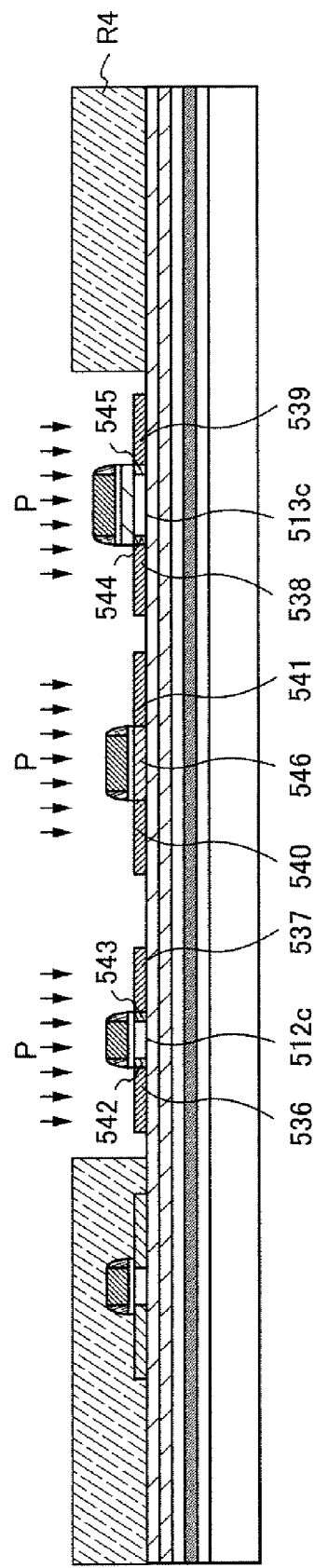
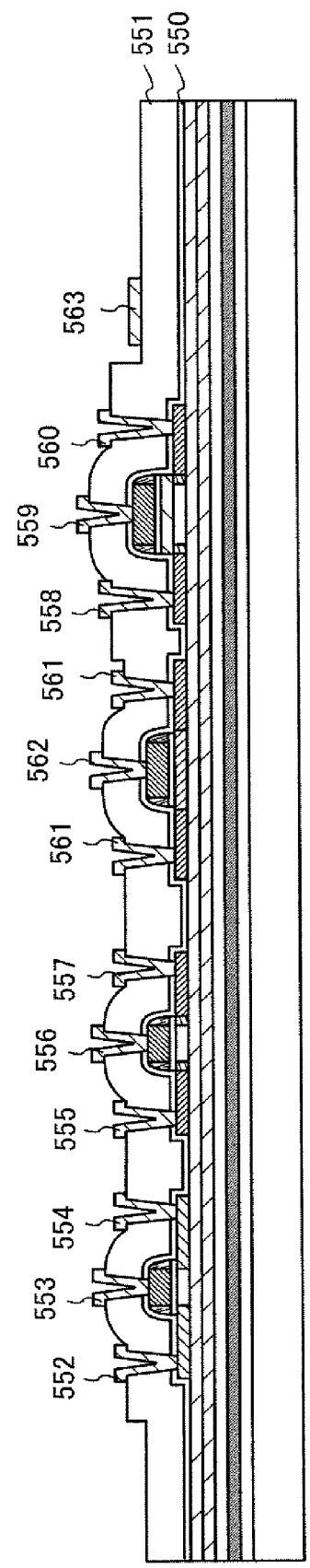
FIG. 20A
FIG. 20B

400

400

400

400

400

400

METHOD FOR FORMING SEMICONDUCTOR DEVICE

BACKGROUND OF THE INVENTION

1. Field of the Invention

The present invention relates to a technology for crystallizing a semiconductor by irradiation with laser light. Further, the present invention relates to a method for forming a semiconductor device using a semiconductor film crystallized by being irradiated with laser light.

2. Description of the Related Art

Technologies for crystallizing an amorphous silicon film by irradiation with laser light is one of the important technologies in order to form a semiconductor integrated circuit using thin film transistors (TFTs) without the use of a silicon wafer.

For example, there is a known technology: a film which is heated by absorbing laser light is formed on an amorphous silicon film and heat generated in the film is utilized, thereby forming crystalline silicon with a large grain diameter. For example, Reference 1 (Japanese Published Patent Application No. 2003-178979) describes: a blocking layer, a semiconductor film shaped into a predetermined form, a barrier film, and a thermal insulating film formed of amorphous silicon are staked in this order over a substrate, and irradiation with laser light from a continuous wave laser is performed from the substrate side, whereby a semiconductor region is melted and crystallized; and the propagation direction of heat in the semiconductor film is controlled with the thermal insulating film; accordingly, the diameter of crystal grains can be increased (refer to the paragraphs [0045], [0057], and the like in Reference 1).

Further, Reference 2 (Yuta SUGAWARA and 5 others, "crystallization of a Si thin film with a two-layer structure by 22a-W-8 solid green laser anneal," preliminary drafts for the 53rd spring meeting of the Japan Society of Applied Physics and Related Societies in 2006, No. 2, p. 888 (March, 2006)) reports that SiN, $SiO_2$, first a-Si, $SiO_2$, and second a-Si are stacked over quartz glass, and irradiation with solid green laser light with a wavelength of 532 nm is performed, so that the first a-Si is crystallized to be microcrystalline Si, and the second a-Si is crystallized to be polycrystalline Si with a grain diameter of about 1 μm. According to the report of Reference 2, it is considered that the first a-Si effectively functions as a heat source in this crystallization.

Reference 3 (Japanese Published Patent Application No. 2003-168646) describes: an amorphous silicon film and a molybdenum film are stacked in this order over a substrate, and the molybdenum film is irradiated with laser light from a continuous wave YAG laser, whereby the molybdenum film is heated and the amorphous silicon is melted by heat of the molybdenum film and thus crystallized.

Reference 4 (Japanese Published Patent Application No. H4-212410) describes: amorphous silicon is crystallized by irradiation with incoherent light such as lamp light instead of laser light. In Reference 4, an amorphous silicon film, an insulating film, and a light absorption layer are stacked in this order over a substrate, and irradiation with lamp light is performed to heat the light absorption layer, so that the amorphous silicon film is crystallized by heat conducted from the light absorption layer. For the light absorption layer, a metal such as tungsten or molybdenum, polycrystalline silicon, or amorphous silicon is used.

Further, Reference 5 (Masato MAKI and 3 others, "laser crystallization 2 of a silicon film using a 22a-W-9 diamond-like carbon light absorption layer," preliminary drafts for the 53rd spring meeting of the Japan Society of Applied Physics and Related Societies in 2006, No. 2, p. 888 (March, 2006)) reports that a diamond-like carbon film is used for the light absorption layer, and an amorphous silicon film is crystallized by continuous wave $Nd^+$:YAG laser light with a wavelength of 1064 nm.

SUMMARY OF THE INVENTION

As is similar to a MOS transistor formed over a silicon wafer, a thin film transistor is also required to be miniaturized. However, miniaturization of a transistor to have a width of 1 μm or smaller in a gate electrode causes a short channel effect, and inversely affects electric characteristics of the transistor. As methods for suppressing a short channel effect, (1) thinning a semiconductor layer to be a channel formation region, (2) thinning a gate insulating film, (3) lowering the impurity concentration in a semiconductor layer, or the like can be given.

Researches by inventors of the present invention found that it is desirable for a channel formation region of a thin film transistor to have a thickness of 50 nm or smaller, more preferably, 40 nm or smaller in order to suppress a short channel effect when the width of a gate electrode is 1 μm or smaller. However, crystallization of an amorphous silicon film with a thickness of 50 nm or smaller with a laser is highly difficult for reasons described below.

A crystal structure of a crystalline silicon film formed by being irradiated with laser light depends on energy of the laser light. As energy of the laser light increases, a crystal structure of a silicon irradiated with the laser light changes into a microcrystal, a crystal with a small grain diameter, and a crystal with a large grain diameter. It has been found that energy to melt a silicon film completely is necessary for forming a crystal with a large grain diameter. Laser light with too high energy causes a split or ablation in a silicon film, and thus the shape of the film cannot be kept.

A state in which a film is completely melted means that the film is melt, i.e., the film is in a liquid phase, from a top surface of the film to an interface between the film and a surface on which the film is formed. Partial melt means a state in which a portion in a liquid phase and a portion in a solid phase are present from a top surface of a film to an interface between the film and a surface on which the film is formed.

Light absorption rate of silicon depends on wavelength of light and film thickness. Further, absorption rate and the like vary between a solid phase and a liquid phase. FIG. 6 is a graph showing film thickness dependence of absorption rates of amorphous silicon in a solid phase and liquid-phase silicon with respect to light with the wavelength of 532 nm. In the graph of FIG. 6, the horizontal axis shows a thickness of the amorphous silicon film and the vertical axis shows an absorption rate. FIG. 7 is a graph showing film thickness dependence of a ratio (=liquid-phase silicon/solid-phase silicon) of light (the wavelength of 532 nm) absorption rate of the liquid-phase silicon with respect to the solid-phase amorphous silicon. As laser light with the wavelength of 532 nm, a second harmonic of a $Nd:YVO_4$ laser can be given, for example.

As shown in FIG. 6, an absorption rate of amorphous silicon drops sharply when the amorphous silicon has a thickness of 50 nm or smaller. Therefore, output of a laser needs to be increased in order to melt and crystallize amorphous silicon with a thickness of 50 nm or smaller. On the other hand, the graph of FIG. 7 shows that an absorption rate changes sharply because of a change of the amorphous silicon film from a solid phase to a liquid phase when the amorphous silicon film has a thickness of 50 nm or smaller.

Accordingly, just after an amorphous silicon film changes from a solid phase to a liquid phase by irradiation with laser light, an absorption rate changes sharply; as a result, energy is insufficiently supplied or oversupplied to the silicon, and thus it is difficult to supply adequate energy for growing a crystal grain. Further, a laser oscillator itself varies in output. Therefore, there is a problem in that an appropriate range of the output of a laser for forming a crystal with a large grain diameter is highly narrow when a silicon film has a thickness of 50 nm or smaller. Accordingly, laser crystallization of a silicon film with a thickness of 50 nm or smaller has a low yield, and makes it highly difficult to achieve uniform crystallization with the laser.

Further, the thicker a silicon film is, the more hardly the silicon film can withstand a sharp change of a thermal stress due to irradiation with laser light, and part of a crystallized portion can have a peeling or strip easily, so that laser crystallization with uniform crystallinity is difficult.

An object of the present invention is to provide a method for crystallizing a semiconductor film with a thickness of 50 nm or smaller by laser light irradiation in a high yield in order to solve the above problems.

The present invention, which is aimed at solving the above problems, is a laser crystallization technology to enable a semiconductor film to be crystallized and a crystalline semiconductor to be formed by forming the semiconductor film over a substrate, forming a light absorption film with a property of generating heat by absorbing laser light, irradiating the semiconductor film with laser light through the light absorbing film, and melting the semiconductor film and the light absorption film. Further, an aspect of the present invention is a method for forming a semiconductor device in which an element including a crystalline semiconductor film formed by shaping a crystalline semiconductor into a desired form is formed.

Melting a light absorption film of an upper layer together with a semiconductor film of a lower layer allows heat conduction from the melted light absorption film to the semiconductor film of the lower layer, whereby time for melting the semiconductor film can be extended and the growth distance of a crystal of the semiconductor film can be increased.

Further, changing the light absorption film from a solid phase to a liquid phase increases the reflection rate of the light absorption film with respect to laser light, and hardly allows the light absorption film to transmit the laser light. Accordingly, the semiconductor film in a melted state cannot absorb the laser light, which can prevent energy from the laser light from being oversupplied to the semiconductor film in a liquid state.

That is to say, in the present invention, the semiconductor film is heated by absorbing the laser light first, and melted completely. At the same time, the light absorption film is also heated by absorbing the laser light and melted completely. Then, as a result of melting the light absorption film, the laser light hardly reaches the semiconductor film, and thus the semiconductor film is mainly heated by heat conduction from the light absorption film. Further, the light absorption film changes from a solid state to a liquid state, thereby serving as a source to supply heat to the semiconductor film and further preventing the semiconductor film from being overheated.

Therefore, the laser crystallization method according to the present invention enables a semiconductor film with a thickness of 50 nm or smaller, or 40 nm or smaller to be melted completely to grow a crystal in a high yield. Further, an output range of a usable laser can be increased. In the present invention, note that a semiconductor film with a thickness of larger than 50 nm can also be melted completely to be crystallized, and a semiconductor film can have a thickness of 200 nm or smaller.

In the present invention, it is preferable to form the semiconductor film using a semiconductor which is mainly composed of silicon or germanium. The semiconductor which is mainly composed of silicon is silicon, germanium, silicon germanium ($Si_xGe_{1-x}$, $0<x<1$), or the like. It is acceptable as long as the semiconductor film has a non-single crystalline structure. It is preferable that the crystalline structure be amorphous or microcrystalline.

As the light absorption film, a film with a property of transmitting laser light and is melted by absorbing the laser light is used. For example, the light absorption film can be formed using a semiconductor film. It is preferable that the light absorption film have a thickness of 30 to 200 nm inclusive because it is melted by laser light irradiation.

The semiconductor film used for the light absorption film can be formed using a semiconductor which is mainly composed of silicon or germanium, as is similar to the semiconductor film of the lower layer. The semiconductor which is mainly composed of silicon or germanium is silicon, germanium, silicon germanium ($Si_xGe_{1-x}$, $0<x<1$), or the like. When the light absorption film is formed using the semiconductor, the semiconductor has a non-single crystalline structure, and it is preferable that the crystalline structure be microcrystalline or amorphous. Further, it is preferable that the light absorption film be a semiconductor film which has the same crystalline structure as the lower semiconductor film.

In the present invention, it is preferable to form buffer films that are not melted by laser light irradiation under a surface of the semiconductor film and between the semiconductor film and the light absorption film, respectively, because the light absorption film and the semiconductor film are melted by the laser light irradiation. For example, the buffer film under the surface of the semiconductor film is formed between the semiconductor film and a substrate.

A first buffer film that is formed between the semiconductor film and the substrate can have a function of a base film for an element formed using a crystalline semiconductor film crystallized by laser light irradiation. Further, the first buffer film can have a function of a barrier layer, which prevents impurities from entering the element. Furthermore, the first buffer film can have a function of a thermal relaxation layer, which does not easily conducts heat to the substrate even when the temperature of the semiconductor layer increases by laser light irradiation.

A second buffer film that is formed between the light absorption film and the semiconductor film prevents the melted light absorption film and the melted semiconductor film from mixing. Further, when the light absorption film is etched to be removed, it is preferable that the second buffer film function as an etching stopper so that the semiconductor film is not removed.

The first buffer film and the second buffer film can be formed using an insulating film with a single-layer or stacked-layer structure.

In the present invention, a wavelength of laser light which is absorbed in the semiconductor film is employed. For example, it is preferable that the wavelength be 100 to 800 nm inclusive, more preferably, 350 to 750 nm inclusive. For the laser light, a harmonic (typically, a second harmonic or a third harmonic) as well as a fundamental wave can be used.

As the laser light, laser light emitted from a continuous wave laser (hereinafter, referred to as a "CW laser"), a quasi-continuous-wave layer (hereinafter, referred to as a "quasi-CW layer"), or a pulsed laser can be used. Among the pulsed lasers, a pulsed laser with a repetition rate of 10 MHz or higher is called a quasi-CW laser. Such a laser can keep a portion which is being irradiated with laser light in a complete melt state, as is similar to a CW laser. Therefore, also when a quasi-CW laser is used, an interface between a solid phase and a liquid phase can be moved in the semiconductor film by scanning with the laser light in a similar manner to a CW laser.

Further, it is also possible to perform irradiation with laser light, with beam spots of beams emitted from a plurality of lasers overlapping with each other. In this case, either the same or different kinds of lasers may be used.

The present invention enables a semiconductor film with a thickness of 50 nm or smaller to be crystallized by laser light irradiation in a high yield.

BRIEF DESCRIPTION OF THE DRAWINGS

In the accompanying drawings:

FIGS. 10A to 10D are cross-sectional views to illustrate a method for forming a semiconductor device of the present invention and a method for forming an active-matrix liquid crystal display device;

FIGS. 11A to 11C are cross-sectional views to illustrate steps following the step of FIG. 10D;

FIGS. 12A and 12B are cross-sectional views to illustrate steps following the step of FIG. 11C;

FIG. 15A shows a personal digital assistant, FIG. 15B shows a digital video camera, FIG. 15C shows a cellular phone, FIG. 15D shows a portable television device, FIG. 15E shows a portable computer, and FIG. 15F shows a television device;

FIGS. 17A to 17C are cross-sectional views to illustrate a method for forming a semiconductor device of the present invention and a method for forming a semiconductor device capable of data communication without contact;

FIGS. 18A to 18C are cross-sectional views to illustrate steps following the step of FIG. 17C;

FIGS. 19A to 19C are cross-sectional views to illustrate steps following the step of FIG. 18C;

FIGS. 20A and 20B are cross-sectional views to illustrate steps following the step of FIG. 19C;

DETAILED DESCRIPTION OF THE INVENTION

Hereinafter, methods for crystallizing a semiconductor film of the present invention are described with reference to the drawings. Note that the present invention can be performed in many different modes and it is easily understood by those skilled in the art that the modes and details disclosed herein can be modified in various ways without departing from the spirit and the scope of the present invention. Therefore, the present invention should not be interpreted as being limited to the description of the embodiment modes and embodiments.

Embodiment Mode 1

Figure 1A:
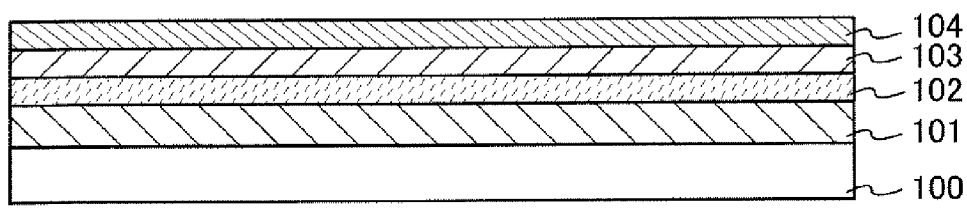
FIGS. 1A to 1C are cross-sectional views to illustrate a method for crystallizing a semiconductor film by laser light irradiation.
Figure 1B:
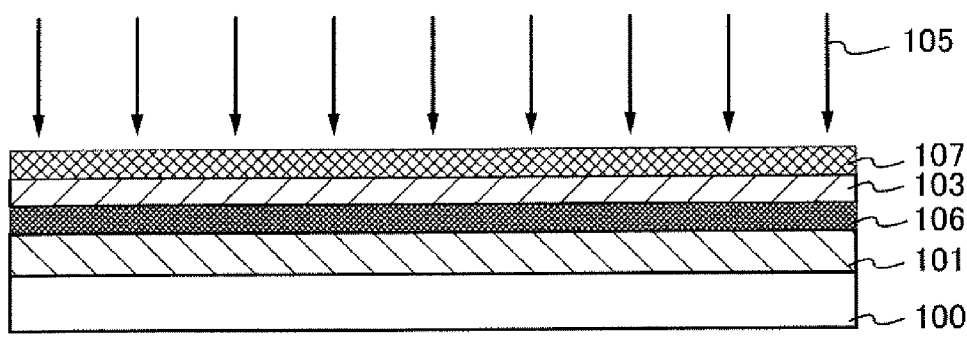
Figure 1C:
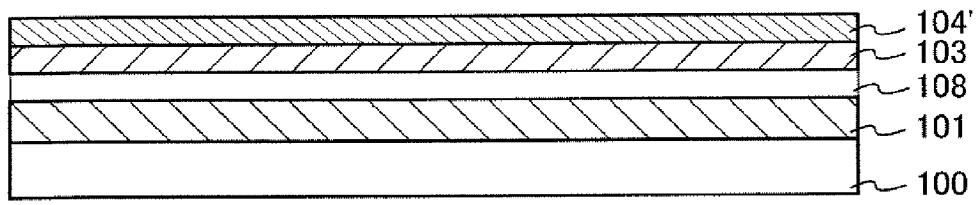
Figure 2:
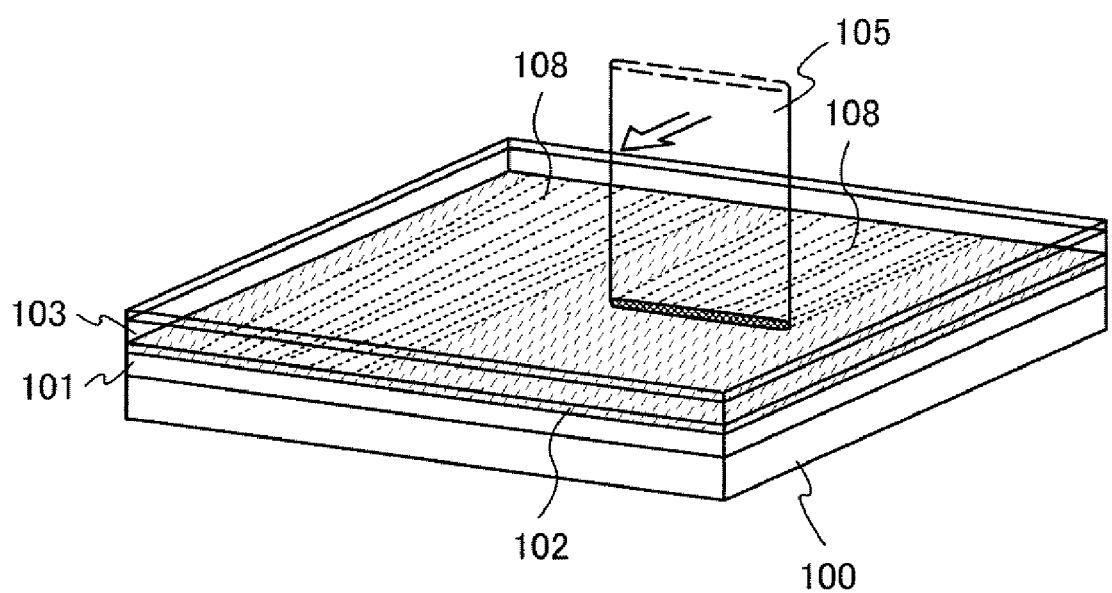
FIG. 2 is a perspective view corresponding to FIGS. 1B and 1C.

With reference to FIGS. 1A to 2, this embodiment mode describes a method for forming a crystalline semiconductor in a first semiconductor film by forming a first buffer film, the first semiconductor film, a second buffer film, and a light absorption film over a substrate and irradiating the first semiconductor film with laser light through the light absorption film and the second buffer film.

FIGS. 1A to 1C are cross-sectional views to illustrate this embodiment mode. First, a substrate 100 is provided. As the substrate 100, a substrate formed of an insulating material such as a glass substrate, a quartz substrate, a sapphire substrate, or a plastic substrate; a conductive substrate such as a stainless steel substrate; or a semiconductor substrate such as a silicon wafer can be used, for example.

As shown in FIG. 1A, a first buffer film 101 is formed over the substrate 100, a first semiconductor film 102 is formed over the first buffer film 101, a second buffer film 103 is formed over the first semiconductor film 102, and a light absorption film 104 is formed over the second buffer film 103.

The first buffer film can have a function of a base insulating film for an element in a semiconductor device. A base insulating film can lower an interface state density between a crystalline semiconductor film included in the element and a surface on which the crystalline semiconductor film is formed. Further, the first buffer film can have a function of a blocking layer, which prevents impurities from entering the element from the substrate 100 side. Therefore, forming the first buffer film 101 allows using a substrate which contains impurities in a larger amount than a quartz substrate, and the like (e.g., a glass substrate or a plastic substrate).

The first buffer film 101 can have a thickness of 10 nm to 1 µm inclusive, preferably, 50 to 500 nm inclusive. As the first buffer film 101, an insulating film with a single-layer structure or a stacked-layer structure can be formed. The insulating film which forms the first buffer film 101 can be formed using an insulating material which is mainly composed of silicon, e.g., silicon oxide ($SiO_x$, $0<x\leqq2$), silicon nitride ($SiN_x$, $0<x\leqq4/3$), or silicon oxynitride ($SiO_xN_y$, $0<x<2$, $0<y<4/3$). When a film in contact with a lower surface of the first semiconductor film 102 is formed using silicon nitride in order to lower an interface state density between the first buffer film 101 and the first semiconductor film which is crystallized, charges are accumulated at an interface level between the film formed of silicon nitride and the first semiconductor film 102 which is crystallized, so that the absolute value of the threshold voltage value of a transistor increases. Therefore, it is preferable to use silicon oxide or silicon oxynitride with a nitride content of 1% or less for forming the film in contact with the lower surface of the first semiconductor film 102. However, these insulating films have a low blocking property against impurities; therefore, it is preferable to form a film made of silicon nitride, which has a high blocking property, or silicon oxynitride with a nitride content of 40% or more between the insulating film and the substrate 100. In such a case, the first buffer film 101 has a two-layer structure including a film formed of silicon nitride or silicon oxynitride with a nitride content of 40% or more and a film formed of silicon oxide or silicon oxynitride with a nitride content of 1% or less. When the first buffer film 101 is formed using a single film formed of silicon oxide or silicon oxynitride with a nitride content of 1% or less, it is preferable to enhance the blocking property by forming the first buffer film 101 to be thick, with a thickness of 500 nm or more.

The insulating film composed mainly of silicon, e.g., silicon oxide, can be formed by a plasma CVD method, a sputtering method, an atomic layer deposition method (an ALD method), or the like. When the first buffer film 101 has a stacked-layer structure, the layers may be formed by different film formation methods.

The first semiconductor film 102 is an object of crystallization, and a semiconductor device is formed using the first semiconductor film which is crystallized. The first semiconductor film 102 can be formed using a semiconductor which is mainly composed of silicon or germanium. The semiconductor which is mainly composed of silicon or germanium is, for example, a semiconductor such as silicon (Si), germanium (Ge), silicon germanium ($Si_{1-x}Ge_x$, $0<x\leqq1$), or silicon carbide (SiC). A film of such a semiconductor material can be formed by a CVD method such as a plasma CVD method, a low-pressure CVD method, or a thermal CVD method, or a sputtering method.

For example, when a silicon film is formed by a CVD method, for example, silane ($SiH_4$) or disilane ($Si_2H_6$) diluted with hydrogen is used as a source gas. By adding $GeH_4$ to this source gas, a silicon germanium film can be formed. When a silicon film is formed by a sputtering method, a target of silicon (Si) is used, for example. Further, when silicon germanium film is formed, a target of silicon (Si) containing germanium (Ge) is used, for example.

Further, the first semiconductor film 102 may contain an impurity element imparting n-type conductivity to a semiconductor, e.g., P (phosphorus) or As (arsenic), or an impurity element imparting p-type conductivity to a semiconductor, e.g., B (boron). Such an impurity element can be contained in the first semiconductor film 102 by the following method, for example: after forming a silicon film or the like in the above manner, such an impurity element is added to the silicon film with an ion doping apparatus or an ion implanting apparatus.

Before laser light irradiation, the first semiconductor film 102 has a non-single crystalline structure, and is preferably amorphous or microcrystalline.

The first semiconductor film 102 can have a thickness of 5 to 150 nm inclusive. In the present invention, the first semiconductor film 102 can be formed to be thin, with a thickness of 5 to 50 nm inclusive, preferably, 5 to 40 nm inclusive. By forming the first semiconductor film 102 to have a thickness of 50 nm or smaller, a thin film transistor can be made with a suppressed short-channel effect and a gate length of 1 µm or smaller.

The second buffer film 103 that is formed between the light absorption film 104 and the first semiconductor film 102 prevents the melted light absorption film 104 and the melted first semiconductor film 102 from being mixed. Further, it is preferable that the second buffer film 103 have a function of an etching stopper so that the first semiconductor film 102 which is crystallized is not removed in etching the light absorption film 104 away after crystallizing the first semiconductor film 102.

The second buffer film 103 is formed using a film with a property of transmitting laser light so that the first semiconductor film 102 of the lower layer is irradiated with the laser light. For example, the second buffer film 103 can be formed using an insulating film with a single-layer structure or a stacked-layer structure. The film for forming the second buffer film 103 can be formed using an insulating material which is mainly composed of silicon, e.g., silicon oxide ($SiO_x$, $0<x\leqq2$), silicon nitride ($SiN_x$, $0<x\leqq4/3$), or silicon oxynitride ($SiO_xN_y$, $0<x<2$, $0<y<4/3$); a metal oxide such as tantalum oxide, hafnium oxide, zirconium oxide, or titanium oxide; or the like. Such an insulating film can be formed by a CVD method, a sputtering method, an ALD method, or the like. When the second buffer film 103 has a stacked-layer structure, the layers can be formed by either the same method or different methods.

It is preferable that the second buffer film 103 have a thickness in which the film is not melted by laser light irradiation and can conduct heat to the first semiconductor film 102 of the lower layer, and the thickness can be 10 to 200 nm inclusive. Further, as is described later, the second buffer film 103 can be used as a film forming the element. In such a case, the thickness of the second buffer film 103 is determined in accordance with the properties of the element.

The light absorption film 104 can be formed using a material with a property of transmitting laser light because the light absorption film 104 has a higher temperature by absorbing the laser light, is melt together with the first semiconductor film 102, and makes the first semiconductor film 102 of the lower layer irradiated with the laser light. For example, the light absorption film 104 can be formed using a semiconductor film, as is similar to the first semiconductor film 102. A material which can be used for the light absorption film 104 is similar to that for the first semiconductor film 102, and a semiconductor which is mainly composed of silicon or germanium, e.g., silicon, germanium, or silicon germanium ($Si_xGe_{1-x}$, $0<x<1$), can be used. When a semiconductor film is used for the light absorption film 104, the semiconductor film has a non-single crystalline structure, and is preferably amorphous or microcrystalline.

It is preferable that the light absorption film 104 have a thickness of 30 to 200 nm inclusive so as to be melted by laser light irradiation.

When a semiconductor film is used for the light absorption film 104 and insulating films are used for the first buffer film 101 and the second buffer film 103, a step shown in FIG. 1A is as follows: the first insulating film 101 is formed over the substrate 100, the first semiconductor film 102 is formed over the first insulating film 101, the second insulating film 103 is formed over the first semiconductor film 102, and the second semiconductor film 104 is formed over the second insulating film 103.

Next, as shown in FIG. 1B, irradiation with laser light 105 is performed from above the light absorption film 104. Note that the first buffer film 101, the first semiconductor film 102, the second buffer film 103, and the light absorption film 104 can contain hydrogen in some cases depending on the film formation method. In such a case, heat treatment is performed at 400 to 550° C. inclusive for about one hour or more to discharge hydrogen from the films before irradiation with the laser light 105. The hydrogen discharge can prevent hydrogen from jetting out due to irradiation with the laser light 105. Heat treatment for discharging hydrogen may be performed every time a film containing hydrogen is formed, or may be performed one time after forming the first buffer film 101, the first semiconductor film 102, the second buffer film 103, and the light absorption film 104. A sputtering method enables forming a film which does not contain hydrogen.

By irradiation with the laser light 105 from the light absorption film 104 side, the first semiconductor film 102 is irradiated with the laser light 105 through the light absorption film 104 and the second buffer film 103. The first semiconductor film 102 is heated by absorbing the laser light. As a result, a region irradiated with the laser light 105 is melted completely to become a semiconductor 106 in a liquid phase. Further, part of the laser light 105 is also absorbed in the light absorption film 104. A region in the light absorption film 104 irradiated with the laser light 105 is melted completely to become a light absorption film 107 in a liquid phase because the light absorption film 104 also absorbs the laser light 105.

The substrate 100 is scanned and irradiated with the laser light 105. With shift of regions irradiated with the laser light 105, the temperature of the semiconductor 106 in a liquid phase falls and the semiconductor 106 in a liquid phase is solidified; as a result, as shown in FIG. 1C, a crystalline semiconductor 108 is formed in the region irradiated with the laser light 105. Further, the light absorption film 107 in a liquid phase is also solidified. In this embodiment mode, the laser absorption film which is melted and solidified is referred to as a light absorption film 104' in order to distinguish this film from the light absorption film 104 that is not irradiated with the laser light yet.

A step of scanning and irradiating with the laser light 105 is described with reference to FIG. 2. FIG. 2 is a perspective view corresponding to the cross-sectional views of FIGS. 1B and 1C. In FIG. 2, hatching in the second buffer film 103 and the light absorption film 104 is omitted in order to avoid a complex diagram. In this embodiment mode, an example in which laser light emitted from a CW laser is used as the laser light 105 is described.

A beam spot of the laser light 105 emitted from the CW laser is shaped into a linear form or a rectangular form at an irradiated surface with an optical system. The linear form of the beam spot includes an ellipsoidal form as well as an ideal line. The first semiconductor film 102 is melted completely by irradiation with the laser light 105. Use of the CW laser enables continuous irradiation of the first semiconductor film 102 with the laser light 105; thus, when the laser light 105 moves relatively with respect to the substrate 100, an interface between the first semiconductor film 102 in a solid phase and the semiconductor 106 in a liquid phase moves in the movement direction of the laser light 105, so that the crystalline semiconductor 108 can grow laterally.

Even when a quasi-CW laser with a pulse repetition rate of 10 MHz or more is used, an interface between a solid phase and a liquid phase in the first semiconductor film 102 can be moved by scanning and irradiating with the laser light 105 in a similar manner to the CW laser; as a result, the crystalline semiconductor 108 can grow laterally.

A pulsed laser with a pulse repetition rate lower than 10 MHz can also be used. In this case, scanning with the laser light 105 is performed so that irradiation regions of the laser light 105 overlap with each other, and the first semiconductor film 102 is irradiated with the laser light 105 so that portions which are melted completely by the laser light 105 are connected, whereby the crystalline semiconductor 108 can grow laterally.

It is also possible to adjust a beam profile of the laser light 105 using a phase shift mask or the like for the optical system for irradiation with the laser light 105.

FIG. 2 shows that the crystalline semiconductor 108 that grows laterally in a scanning direction of the laser light 105 by the irradiation with the laser light 105 is formed in the first semiconductor film 102. In FIG. 2, dotted lines of the crystalline semiconductor 108 designate grain boundaries.

In the present invention, first, the light absorption film 104 is melted completely together with the first semiconductor film 102 by irradiation with the laser light 105. Accordingly, heat from the light absorption film 107 in a liquid phase is conducted to the semiconductor 106 in a liquid phase through the second buffer film 103, so that time for melting the semiconductor 106 in a liquid phase can be extended.

Further, with irradiation with the laser light 105 and the change of the light absorption film 107 from a solid phase to a liquid phase, the reflection rate of the light absorption film 107 with respect to the laser light 105 rises sharply, so that the laser light 105 hardly reaches the semiconductor 106 in a liquid phase. Accordingly, heat is supplied to the semiconductor 106 in a liquid phase mostly through heat conduction from the light absorption film 107 in a liquid state. As a result, the first semiconductor film 104 changes from a solid phase to a liquid phase; thus, even when the absorption rate of the first semiconductor film 104 with respect to the laser light 105 rises sharply, the light absorption film 107 in a liquid phase reflects the laser light 105, which can prevent energy from the laser light 105 from being oversupplied to the semiconductor 106 in a liquid phase.

Therefore, the laser crystallization technology of this embodiment mode can increase a usable output range of a laser. As a result, the first semiconductor film 102 can be crystallized by laser light irradiation in a high yield even when the first semiconductor film 102 has a thickness of 50 nm or smaller.

The wavelength of the laser light 105 is set so that the laser 105 is absorbed in the first semiconductor film 102 in order to melt the first semiconductor film 102 completely. For example, the laser light 105 can be set to have a wavelength of 100 to 800 nm inclusive, preferably, 350 to 750 nm inclusive. For the laser light 105, a harmonic (typically, a second harmonic or a third harmonic) as well as a fundamental wave of the laser light can be used.

It is preferable to use the same material (more preferably, with the same crystalline structure) for the light absorption film 104 as that for the first semiconductor film 102 in order to melt the light absorption film 104 completely together with the first semiconductor film 102 by irradiation with the laser light 105. For example, the first semiconductor film 102 and the light absorption film 104 are formed using amorphous silicon or microcrystalline silicon.

Further, the scanning speed (the relative movement speed with respect to the substrate 100) and the output of the laser light 105 is adjusted so that the first semiconductor film 102 is melted completely. For example, with the use of two or more lasers, beam spots of laser light emitted from each of the laser overlap with each other, so that energy of the laser light can be increased to a required value. When a plurality of lasers are used, laser light to be emitted can have different wavelengths. Further, lasers with different oscillation operations, such as continuous-wave oscillation, quasi-continuous-wave oscillation, and pulsed oscillation, can be combined.

Lamp light, which is emitted from a lamp, can also be used for irradiation instead of the laser light. In such a case, it is acceptable as long as light emitted from a lamp includes a wavelength in which the light can be absorbed in the first semiconductor film: preferably, 100 to 800 nm inclusive; more preferably, an intensity peak in a range of 350 to 750 nm inclusive.

When a semiconductor film which is mainly composed of silicon is used for the first semiconductor film 102, an element which promotes silicon crystallization can be introduced to the first semiconductor film 102. The element with such action is a metal element such as nickel (Ni), palladium (Pd), cobalt (Co), platinum (Pt), iron (Fe), tin (Sn), lead (Pb), copper (Cu), or gold (Au).

A step of adding the above element to the first semiconductor film 102 is performed before forming the second buffer film 103. Specifically, there are the following methods, for example: (1) a thin film of a single metal, a metal compound, or an alloy is formed with a thickness of about several nm on a surface of an amorphous silicon film by a sputtering method or a vapor deposition method; or (2) an amorphous silicon film is coated with a mixture of a single metal, a metal compound, or an alloy, and a solvent by a spin-coating method, a printing method, or the like. In the method (2), a metal compound or the like may be dissolved, or may be dispersed without dissolving in the solvent.

When the method (2) is used, a polar solvent such as water, alcohol, acid, or ammonium can be used. For example, when nickel is added as a metal element, an aqueous solution of nickel bromide or nickel acetate can be used. Further, a non-polar solvent such as benzene, toluene, xylene, carbon tetrachloride, chloroform, or ether can be used. When a polar solvent is used, it is preferable to oxidize a surface of the first semiconductor film 102 with ozone, UV light, or the like in order to enhance the wettability of the first semiconductor film 102.

With addition of the above metal element, a transistor with a high source-drain voltage resistance can be made using the first semiconductor film 102 which is crystallized.

Embodiment Mode 2

With the use of a crystalline semiconductor film formed using a crystallization method of the present invention, various semiconductor devices can be made. The crystallization method of the present invention enables forming a non-single crystalline semiconductor film with a thickness of 50 nm or smaller in a high yield. Accordingly, even when a gate is miniaturized to have a width of 1 μm or smaller, a transistor with a suppressed short-channel effect can be formed. This embodiment mode describes a method for forming a semiconductor device including a crystalline semiconductor formed by the laser crystallization described in Embodiment mode 1 with reference to FIGS. 3A to 5E.

FIGS. 3A to 5E are cross-sectional views showing a method for forming a semiconductor device having an element including a crystalline semiconductor. First, with reference to FIGS. 3A to 4D, a method for forming a semiconductor device which includes an element including a semiconductor film crystallized by laser light irradiation and an insulating film formed as a second buffer film is shown. In this embodiment mode, a method for forming a thin film transistor (TFT) and a capacitor as elements over one substrate is shown. Next, with reference to FIGS. 5A to 5E, a method for forming a plurality of transistors with different gate insulating film structures over one substrate is described.

Figure 3A:
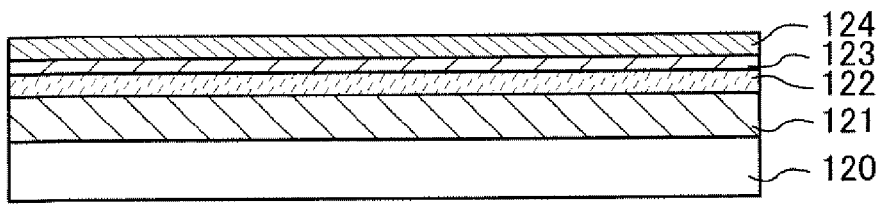
FIGS. 3A to 3D are cross-sectional views to illustrate a method for forming a semiconductor device including a semiconductor element including a crystalline semiconductor film and a second buffer film.

A crystalline semiconductor film is formed by the laser crystallization method of Embodiment Mode 1. First, as shown in FIG. 3A, a first buffer film 121, a first semiconductor film 122, a second buffer film 123, and a light absorption film 124 are stacked over a substrate 120. In this embodiment mode, the second buffer film 123 is formed using an insulating film with a single-layer or stacked-layer structure, and a gate insulating film of the thin film transistor and a dielectric of the capacitor are formed using the second buffer film 123.

Figure 3B:
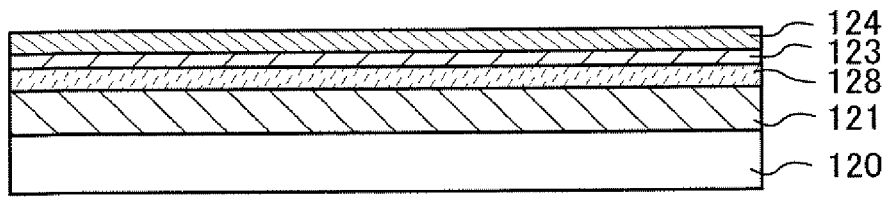

Next, irradiation with laser light is performed from above the light absorption film 124, so that the first semiconductor film 122 and the light absorption film 124 are melted completely. As shown in FIG. 3B, a crystalline semiconductor 128 is formed in the first semiconductor film 122 by scanning and irradiating the substrate with laser light. It is not necessary to irradiate the entire first semiconductor film 122 with the laser light, and at least a portion where the element is formed using the crystalline semiconductor needs to be irradiated with the laser light.

After laser light irradiation, the light absorption film 124, which is not used for the element, is removed by etching. Then, an impurity element imparting n-type or p-type conductivity is added to the crystalline semiconductor 128 in order to form an electrode of the capacitor. The impurity element imparting n-type conductivity is phosphorus (P), arsenic (As), or the like. The impurity element imparting p-type conductivity is boron (B) or the like. In a method for forming a semiconductor device shown in FIGS. 3A to 4D, a case of an n-type impurity region of the element is described.

Figure 3C:
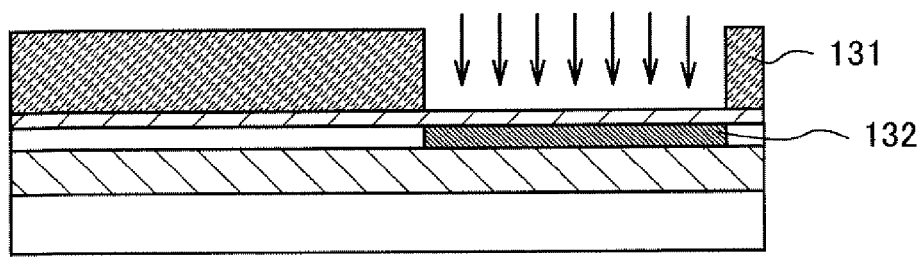

In order to form the n-type impurity region, a resist mask 131 is formed over the second buffer film 123 as shown in FIG. 3C. An impurity element imparting n-type conductivity is added to the crystalline semiconductor 128 by an ion implantation method or a plasma doping method, whereby an n-type first impurity region 132 is formed. A portion where the first impurity region 132 of the crystalline semiconductor 128 is formed is included in the capacitor.

Figure 3D:
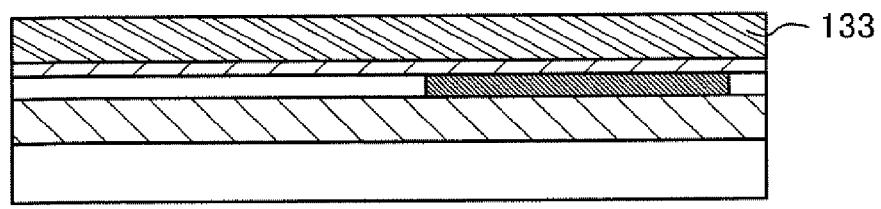

After the mask 131 is removed, as shown in FIG. 3D, a conductive film 133 with a single-layer or stacked-layer structure is formed. As a material for forming the conductive film 133, a metal, an alloy, a metal compound, polycrystalline or microcrystalline silicon containing P or As, or the like can be given. As the metal, tungsten (W), molybdenum (Mo), titanium (Ti), tantalum (Ta), aluminum (Al), chromium (Cr), niobium (Nb), copper (Cu), nickel (Ni), cobalt (Co), or the like can be used. As the alloy or the metal compound, a material which is mainly composed of the above metal element can be used. As the alloy, an aluminum-titanium alloy, an aluminum-neodymium alloy, or the like can be used. As the metal compound, metal nitride such as tantalum nitride, tungsten nitride, molybdenum nitride, or titanium nitride; silicide of, e.g., tungsten (W), molybdenum (Mo), titanium (Ti), tantalum (Ta), nickel (Ni), or cobalt (Co); or the like can be used. The conductive film 133 can be formed by a CVD method, a sputtering method, a vapor deposition method, or the like.

Figure 4A:
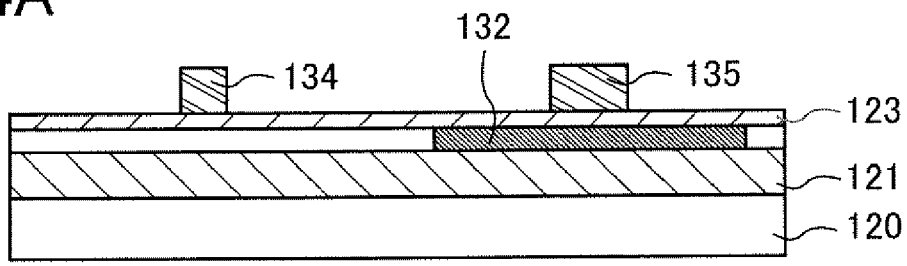
FIGS. 4A to 4D are cross-sectional views to illustrate steps after the step of FIG. 3C.

Then, the conductive film 133 is shaped into a desired form through a photolithography process and an etching process, so that first conductive films 134 and 135 are formed as shown in FIG. 4A. The first conductive film 134 forms a gate electrode of the thin film transistor. The first conductive film 135 forms an electrode of the capacitor. Therefore, the first conductive film 135 is formed so as to overlap with the first impurity region 132 with the second buffer film 123 interposed therebetween.

Figure 4B:
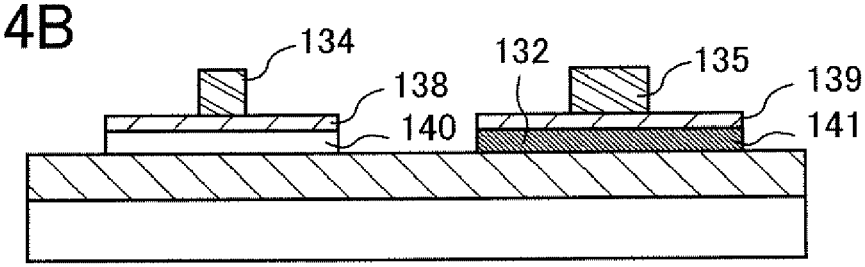

Next, a resist mask with a desired shape is formed through a photolithography process. The second buffer film 123 and the first semiconductor film 122 in which the crystalline semiconductor 128 is formed are etched using the mask. Then, as shown in FIG. 4B, first insulating films 138 and 139 formed from the second buffer film 123 and crystalline semiconductor films 140 and 141 formed from the crystalline semiconductor 128 are formed.

The first insulating film 138 forms a gate insulating film of the thin film transistor, and the crystalline semiconductor film 140 forms a semiconductor layer including at least a source region, a drain region, and a channel formation region of the thin film transistor. The first insulating film 139 forms a dielectric layer of the capacitor. The crystalline semiconductor film 141 forms the electrode of the capacitor, and is formed so as to include the first impurity region 132.

Figure 4C:
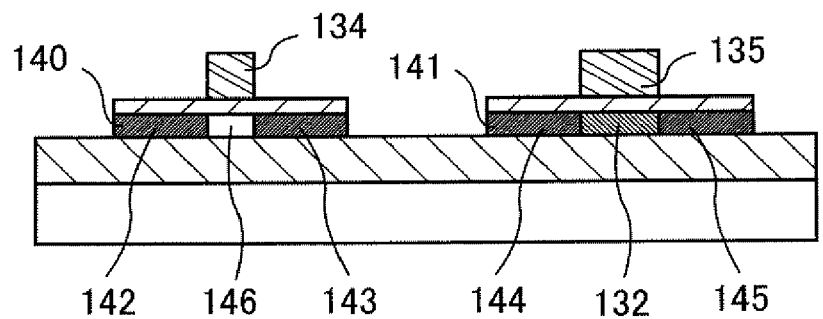

As shown in FIG. 4C, n-type impurity regions are formed in the crystalline semiconductor films 140 and 141. An impurity element imparting n-type conductivity is added to the crystalline semiconductor films 140 and 141 by an ion implantation method or an ion doping method using the first conductive films 134 and 135 as masks, so that n-type second impurity regions 142 and 143 are formed in the crystalline semiconductor film 140, and n-type second impurity regions 144 and 145 are formed in the crystalline semiconductor film 141. After forming the second impurity regions 142 to 145, heat treatment is performed to activate the impurity element that imparts conductivity and is added to the crystalline semiconductor films 140 and 141. This heat treatment can be performed by irradiation with laser light or lamp light, or treatment with a heating furnace.

The second impurity regions 142 and 143, which are formed in the crystalline semiconductor film 140, function as a source region and a drain region. Further, in the crystalline semiconductor film 140, a channel formation region 146 is formed in a portion overlapping with the first conductive film 134 by forming the second impurity regions 142 and 143. In the crystalline semiconductor film 141, the first impurity region 132 remains in a portion overlapping with the first conductive film 135 by forming the second impurity regions 144 and 145.

Next, it is preferable to perform hydrogenation treatment in order to terminate dangling bonds in the crystalline semiconductor films 140 and 141. Hydrogenation can be performed, for example, through heat treatment in hydrogen plasma or an atmosphere containing a hydrogen gas. Alternatively, the crystalline semiconductor films 140 and 141 are covered with a silicon nitride film or silicon oxynitride film containing hydrogen, with the first conductive films 134 and 135 and the first insulating films 138 and 139 interposed therebetween; after that, hydrogenation can be performed through heat treatment at 400 to 450° C. inclusive in a nitrogen atmosphere. The reason is that hydrogen is discharged from the silicon nitride film or the silicon oxynitride film through the heat treatment. The silicon nitride film or silicon oxynitride film containing hydrogen can be formed by a plasma CVD method by adding a hydrogen gas to a source gas.

Figure 4D:
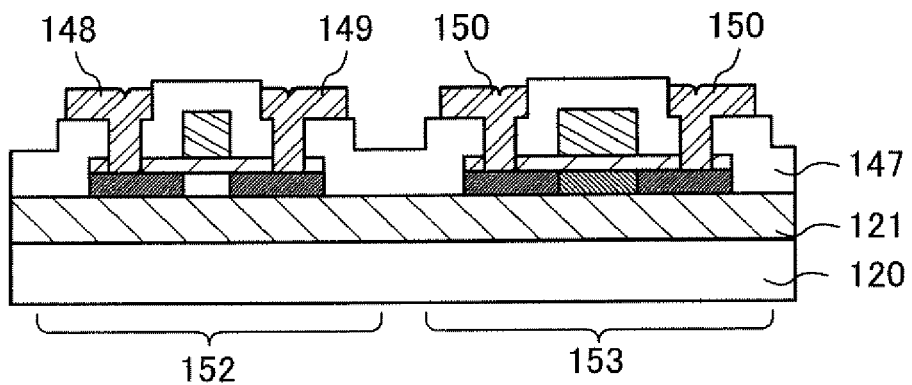

Next, as shown in FIG. 4D, a second insulating film 147 with a single-layer or stacked-layer structure is formed over the first conductive films 134 and 135, the first insulating films 138 and 139, and the crystalline semiconductor films 140 and 141. After forming contact holes at predetermined portions in the second insulating film 147, a conductive film is formed. This conductive film is shaped into a predetermined form through a photolithography process and an etching process, so that second conductive films 148 to 150 are formed. The second conductive films 148 and 149 form a source electrode and a drain electrode. Although FIG. 4D shows as if the second conductive film 150 were two electrodes, the second conductive film 150 forms one electrode, and is connected electrically to the second impurity region 144 and the second impurity region 145.

An insulating layer for forming the second insulating film 147 can be formed using an inorganic material or an organic material. For example, the second insulating film 147 can be formed using an insulating material such as an insulator which is mainly composed of silicon, e.g., silicon oxide, silicon nitride, or silicon oxynitride; a polyimide resin; an acrylic resin; or an insulator which is formed by applying and firing siloxane polymer and has a siloxane bond, to have a single-layer structure or a stacked-layer structure including a plurality of films. For the conductive film which forms the second conductive films 148, 149, and 150, the same material as that of the conductive film 133 can be selected.

Through the above steps, a thin film transistor 152 and a capacitor 153 are formed over the same substrate 120. The capacitor 153 is a diode-connected transistor as well as a capacitor with a MIS-type structure.

The thin film transistor 152, which is shown in FIG. 4D, includes the second buffer film 123 as a gate insulating film. The production method as shown in FIGS. 3A to 3D can lower an interface level between the gate insulating film and the channel formation region 146 because the temperature of the interface between the gate insulating film and the channel formation region 146 increases due to laser light irradiation until the first semiconductor film 122 is melted completely. As a result, the thin film transistor 152 with favorable electric characteristics such as a small S value (subthreshold value) and high field-effect mobility can be obtained.

Next, with reference to FIGS. 3A, 3B, and 5A to 5E, another method for forming a semiconductor device is described. In this embodiment mode, a method for forming a semiconductor device which includes a plurality of transistors including gate insulating films with different thicknesses is described.

First, a crystalline semiconductor film is formed by the laser crystalline method of Embodiment Mode 1. First, as shown in FIG. 3A, the first buffer film 121, the first semiconductor film 122, the second buffer film 123, and the light absorption film 124 are stacked over the substrate 120. In the method shown in FIGS. 5A to 5E, the second buffer film 123 is formed using an insulating film with a single-layer or stacked-layer structure, and the second buffer film 123 forms a gate insulating film of the thin film transistor.

Next, laser light irradiation is performed from above the light absorption film 124, so that the first semiconductor film 122 and the light absorption film 124 are melted completely. As shown in FIG. 3B, the crystalline semiconductor 128 is formed in the first semiconductor film 122 by scanning and irradiating the substrate with laser light.

Figure 5A:
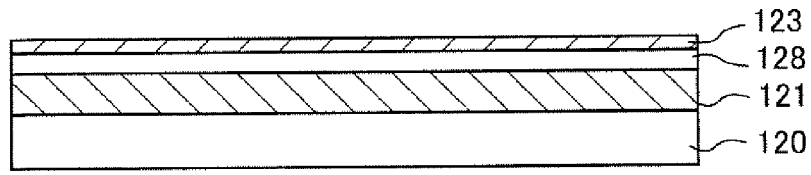
FIGS. 5A to 5E are cross-sectional views showing a method for forming a semiconductor device including a semiconductor element including a crystalline semiconductor film and a second buffer film.
Figure 5B:
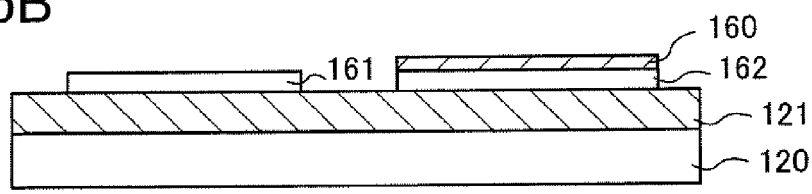

After the laser light irradiation, the light absorption film 124 is removed by etching, as shown in FIG. 5A. Next, a resist mask with a desired shape is formed through a photolithography process. The second buffer film 123 and the first semiconductor film 122 in which the crystalline semiconductor 128 is formed are etched using the mask; as shown in FIG. 5B, a first insulating film 160, which is formed from the second buffer film 123, and crystalline semiconductor films 161 and 162, which are formed from the crystalline semiconductor 128, are formed. In this embodiment mode, the second buffer film 123 remains only at an upper portion of the crystalline semiconductor film 162.

The production method in FIGS. 5A to 5E shows that two transistors are formed over the substrate 120. The first insulating film 160 forms the gate insulating film of one of the transistors. The crystalline semiconductor films 161 and 162 each form a semiconductor layer including at least a source region, a drain region, and a channel formation region of the thin film transistors.

Figure 5C:
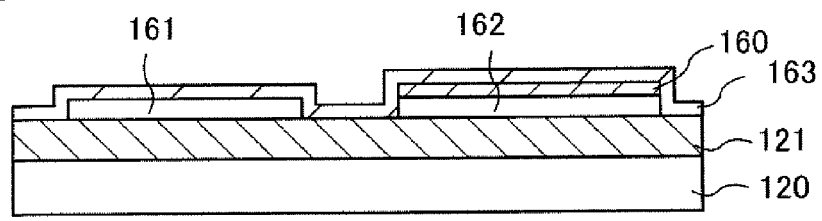

Next, as shown in FIG. 5C, a second insulating film 163 that covers the crystalline semiconductor films 161 and 162 is formed. The second insulating film 163 forms the gate insulating film of the thin film transistors. The second insulating film 163 can be formed using an insulating film with a single-layer or stacked-layer structure. The film for forming the second insulating film 163 can be formed using an insulating material which is mainly composed of silicon, e.g., silicon oxide ($SiO_x$, $0<x\leq2$), silicon nitride ($SiN_x$, $0<x\leq4/3$), or silicon oxynitride ($SiO_xN_y$, $0<x<2$, $0<y<4/3$); metal oxide such as tantalum oxide, hafnium oxide, zirconium oxide, or titanium oxide; or the like. These films can be formed by a CVD method, a sputtering method, an ALD method, or the like.

Figure 5D:
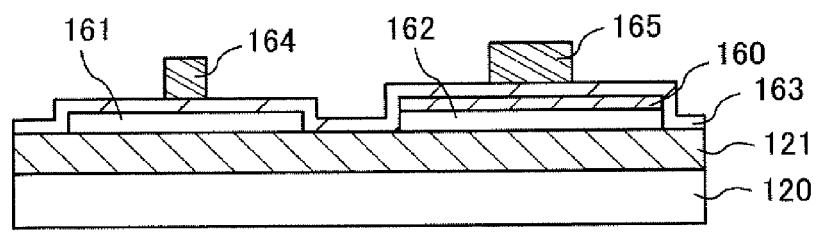

A conductive film is formed over the second insulating film 163. Next, the conductive film is shaped into a desired form through a photolithography process and an etching process, so that first conductive films 164 and 165 are formed as shown in FIG. 5D. The first conductive films 164 and 165 form gate electrodes of the transistors. The first conductive films 164 and 165 can be formed using the same conductive film as the conductive film 133 in FIG. 3D.

Figure 5E:
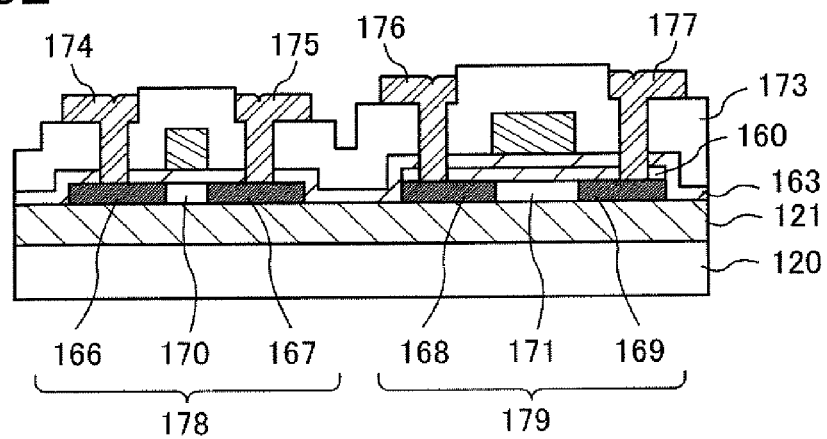
Figure 6:
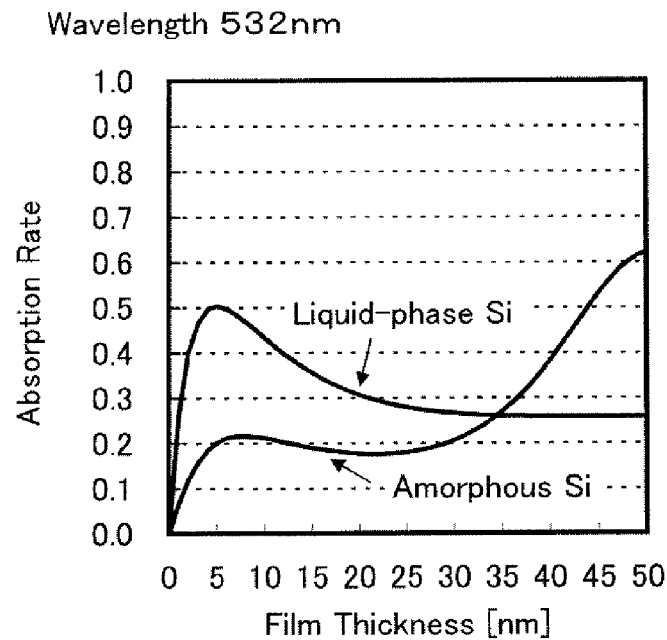
FIG. 6 is a graph showing film thickness dependence of absorption rates of amorphous silicon in a solid phase and liquid-phase silicon with respect to light with the wavelength of 532 nm.
Figure 7:
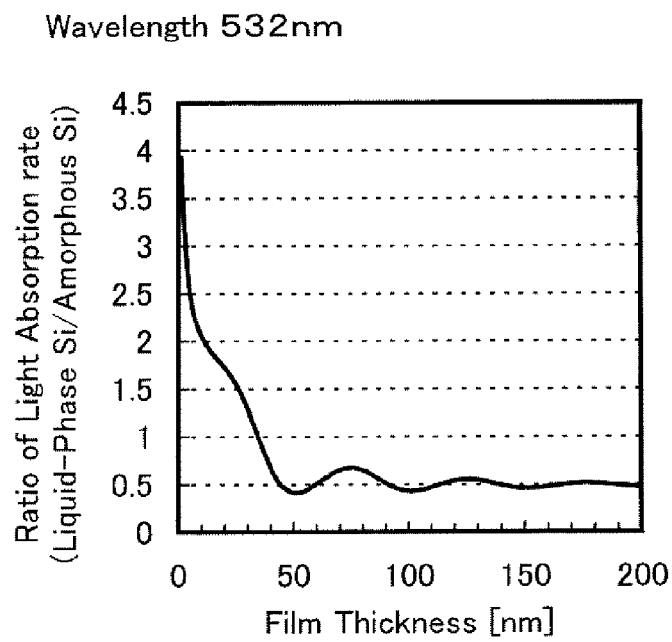
FIG. 7 is a graph showing a ratio of light (the wavelength of 532 nm) absorption rates of liquid-phase silicon with respect to solid-phase amorphous silicon.

Next, n-type impurity regions are formed. An impurity element imparting n-type conductivity is added to the crystalline semiconductor films 161 and 162 by an ion implantation method or an ion doping method using the first conductive films 164 and 165 as masks. Through the adding step, n-type impurity regions 166 and 167 are formed in the crystalline semiconductor film 161, and n-type impurity regions 168 and 169 are formed in the crystalline semiconductor film 162, as shown in FIG. 5E. The impurity regions 166 to 169 function as source regions or drain regions. Further, by forming the impurity regions 166 to 169, channel formation regions 170 and 171 are formed in portions overlapping with the first conductive films 164 and 165, in the crystalline semiconductor films 161 and 162, respectively.

After forming the impurity regions 166 to 169, the impurity element which imparts conductivity and is added to the crystalline semiconductor films 161 and 162 is activated. Next, hydrogenation treatment is performed in order to terminate dangling bonds in the crystalline semiconductor films 161 and 162. The activation treatment and the hydrogenation treatment can be performed by the above methods.

Next, a third insulating film 173 with a single-layer or stacked-layer structure is formed over the first conductive films 164 and 165, the second insulating film 163, the first insulating film 160, and the crystalline semiconductor films 161 and 162. The third insulating film 173 can be formed in a similar manner to the second insulating film 147 in FIG. 4D.

After forming contact holes at predetermined portions in the third insulating film 173, a conductive film is formed. The conductive film is shaped into a desired form through a photolithography process and an etching process, so that second conductive films 174 to 177 are formed. The second conductive films 174 to 177 form source electrodes or drain electrodes. For the conductive film which forms the second conductive films 174 to 177, the same material as that of the conductive film 133 can be selected.

Through the above steps, two kinds of thin film transistors, a first thin film transistor 178 and a second thin film transistor 179, can be formed over the same substrate 120. The first thin film transistor 178 is different from the thin film transistor 152 in FIG. 4D in that the gate insulating film is formed of the second insulating film 163, which is formed after the laser light irradiation. Owing to this point, the gate insulating film of the first thin film transistor 178 can be formed to be thinner or thicker than the second buffer film 123. Further, a film which forms the gate insulating film can be different from the second buffer film 123.

The second thin film transistor 179 is different from the thin film transistor 152 in that the gate insulating film includes the second buffer film 123 and the second insulating film 163, which is formed after the laser light irradiation. Owing to this point, the gate insulating film of the second thin film transistor 179 can be formed to be thicker than the second buffer film 123.

For example, when the second insulating film 163 is formed to be thin, with a thickness of 40 nm or smaller, the first thin film transistor 178 can be used for a circuit to be operated at high speed, e.g., a flip-flop circuit or a logic circuit; and the second thin film transistor 179 can be used for a high withstand-voltage transistor to constitute a rectifier circuit or the like. In this case, as shown in FIG. 5E, it is preferable that the second thin film transistor 179 have a larger width in the gate electrode (channel length) than the first thin film transistor 178.

Although this embodiment mode shows an example in which only n-type impurity regions are formed in a semiconductor element, a p-type impurity region can be formed. Further, it is also possible to form an element including a p-type impurity region and an element including an n-type impurity region over one substrate.

Although this embodiment mode shows a method for forming a thin film transistor and a capacitor as elements included in a semiconductor device, the elements are not limited to a transistor and a capacitor. With the use of the crystalline semiconductor film, it is possible to form various semiconductor elements: e.g., a rectifier element such as a PN junction diode or a Schottky barrier diode; a resistor element; a photoelectric conversion element; a charge-coupled device (CCD); or a semiconductor memory element including a floating gate electrode, a control gate electrode, and the like. Further, with the combination of these elements and forming circuits with various functions, various semiconductor devices can be formed.

Embodiment 1

Figure 8A:
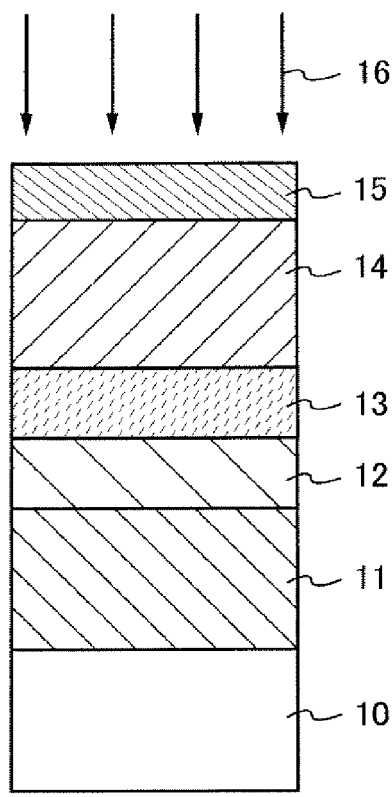
FIGS. 8A and 8B are cross-sectional views to illustrate a method for crystallizing a semiconductor film by laser light irradiation and show an embodiment in which amorphous silicon is used for a first semiconductor film and a light absorption film.
Figure 8B:
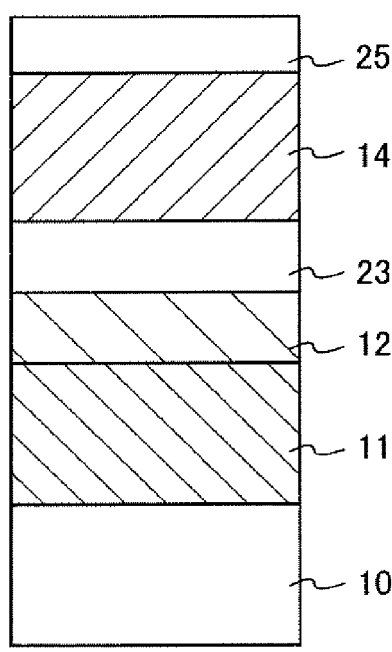

This embodiment describes a method for forming crystalline silicon using amorphous silicon for a first semiconductor film and a light absorption film. FIGS. 8A and 8B are cross-sectional views illustrating this embodiment.

A glass substrate 10 is provided. A first buffer film, a first semiconductor film, a second buffer film, and a light absorption film (a second semiconductor film) were formed in this order over the glass substrate 10. All of these films were formed with a parallel plate plasma CVD apparatus.

First, as shown in FIG. 8A, an insulating film with a two-layer structure is formed as the first buffer film over the glass substrate 10. A silicon oxynitride film 11 was formed to have a thickness of 50 nm as a lower layer, and a silicon oxynitride film 12 was formed to have a thickness of 10 nm as an upper layer. The silicon oxynitride film 11 and the silicon oxynitride film 12 were formed using different source gases, and thus contain oxygen and nitrogen at different concentrations.

$SiH_4$, $NH_3$, and $N_2O$ were used as source gases for the silicon oxynitride film 11 of the lower layer. $SiH_4$ and $N_2O$ were used as source gases for the silicon oxynitride film 12 of the upper layer. The silicon oxynitride film 11 contains nitrogen at a higher concentration than that of the silicon oxynitride film 12, and the silicon oxynitride film 12 contains oxygen at a higher concentration than that of the silicon oxynitride film 11.

An amorphous silicon film 13 was formed to have a thickness of 30 nm as the first semiconductor film over the silicon oxynitride film 12. $SiH_4$ and $H_2$ were used as source gases.

Next, a silicon oxynitride film 14 was formed to have a thickness of 110 nm as the second buffer film over the amorphous silicon film 13. $SiH_4$ and $N_2O$ were used as source gases for the silicon oxynitride film 14.

Next, an amorphous silicon film 15 was formed to have a thickness of 37 nm as the light absorption film (the second semiconductor film) over the silicon oxynitride film 14. $SiH_4$ and $H_2$ were used as source gases.

After forming the amorphous silicon film 15, the stacked films formed over the glass substrate 10 were heated in an electric furnace at 500° C. for an hour, and then at 550° C. for four hours in order to discharge hydrogen from the amorphous silicon films 13 and 15. This heat treatment is performed in order to prevent a hydrogen gas from jetting out from the amorphous silicon films 13 and 15 in laser light irradiation.

After this heat treatment, an oxide film formed on a surface of the amorphous silicon film 15 is removed with hydrofluoric acid (HF). After removing the oxide film, irradiation with laser light 16 was performed through the amorphous silicon film 15 and the silicon oxynitride film 14 as shown in FIG. 8A, so that the amorphous silicon film 13 was crystallized.

The irradiation with the laser light 16 was performed using second harmonics (a wavelength of 532 nm) of two LD pumped $YVO_4$ lasers. Laser light emitted from one of the lasers was deflected with a wavelength plate. The deflected laser light and laser light emitted from the other laser was synthesized using a polarizer, and the synthesized laser light was made to pass through an optical system, so that a beam spot was made to have a linear form at a surface to be irradiated. The synthesis of laser light is performed in order to increase the intensity of laser light. The intensity of the laser light at the surface to be irradiated was 9.3 W, and the beam spot was made to have a linear form with a length of about 500 μm and a width of about 20 μm at the surface to he irradiated. In this embodiment, the glass substrate 10 was moved at a speed of 350 mm/sec in order to perform scanning with the laser light 16.

In a region irradiated with the laser light 16 in the amorphous silicon film 13, crystals have grown parallel to a direction of moving the glass substrate 10, so that crystalline silicon 23 with a large grain diameter was formed. Further, the amorphous silicon film 15 was also crystallized to form crystalline silicon 25 (see FIG. 8B).

Figure 9:
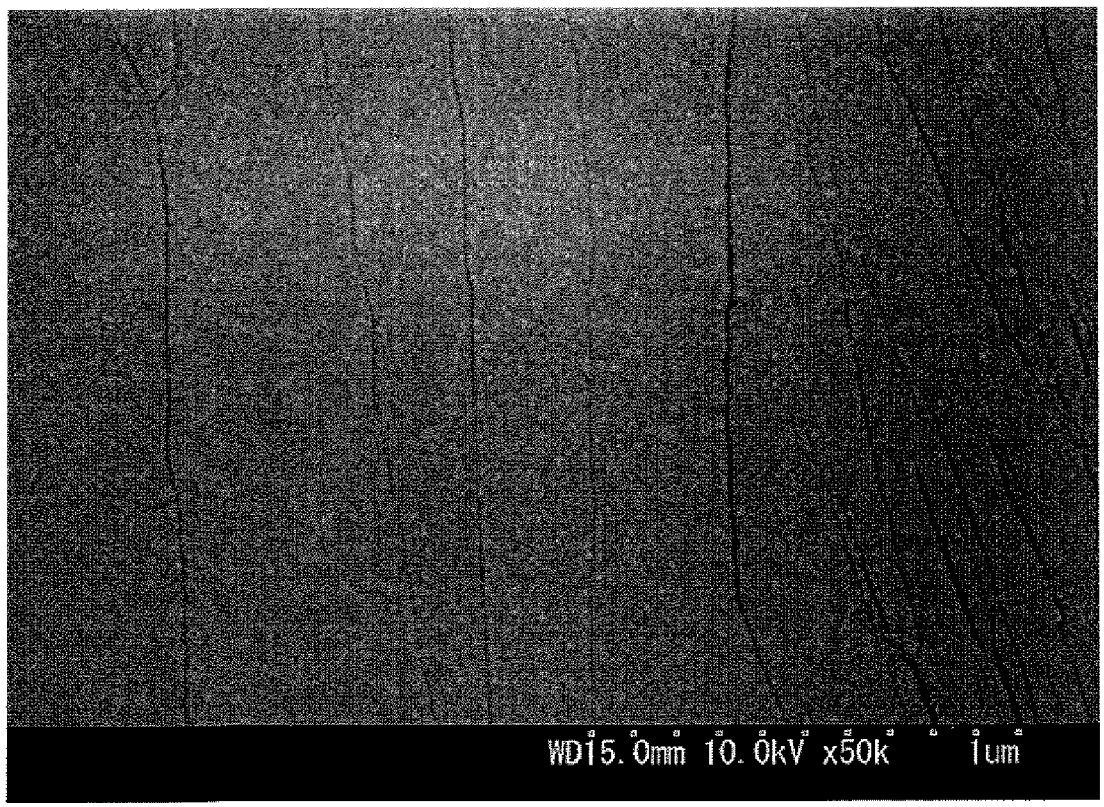
FIG. 9 is a scanning electron micrograph of crystalline silicon formed by laser light irradiation.

With the use of a scanning electron microscope, formation of the crystalline silicon 23 in the amorphous silicon film 13 was confirmed. For the confirmation, the amorphous silicon film 15 and the silicon oxynitride film 14 were removed by etching, and then an upper surface of the amorphous silicon film 13 was observed with the scanning electron microscope. FIG. 9 is a scanning electron micrograph of the crystalline silicon 23 formed by the irradiation with the laser light 16.

The longitudinal direction of the photograph of FIG. 9 is the scanning direction of the laser light 16 (the direction of moving the glass substrate 10). As shown in FIG. 9, it can be observed that the crystalline silicon 23 with grain boundaries along the direction of moving the laser light 16 was formed. Further, FIG. 9 also confirms that the belt-shaped portions do not include a portion which does not keep a shape of a film, e.g., a strip, or a portion which has not been crystallized.

Accordingly, this embodiment confirms that the amorphous silicon film 13 with a thickness of 40 nm or smaller can be crystallized with laser light by melting the amorphous silicon films 13 and 15 completely.

Embodiment 2

This embodiment describes a method for manufacturing a liquid crystal display device, which is an example of a semiconductor device, with reference to FIGS. 10A to 12B. FIGS. 10A to 12B show cross-sectional structures of a terminal portion 263, a drive circuit portion 264, and a pixel portion 265.

As shown in FIG. 10A, an insulating film 181 with a two-layer structure is formed over a glass substrate 180. As a first layer, a silicon oxynitride film ($SiO_xN_y$, $0<x<y$) is formed to have a thickness of 40 to 60 nm by a plasma CVD method, and as a second layer, a silicon oxynitride film ($SiO_xN_y$, $0<y<x$) is formed to have a thickness of 80 to 120 nm by a plasma CVD method. An amorphous silicon film 182 is formed to have a thickness of 5 to 50 nm over the insulating film 181 by a plasma CVD method using $SiH_4$ and $H_2$ as source gases. An insulating film 183 is formed over the amorphous silicon film 182. In this embodiment, a silicon oxynitride film ($SiO_xN_y$, $0<y<x$) is formed to have a thickness of 10 to 200 nm as the insulating film 183 by a plasma CVD method. An amorphous silicon film 184 is formed to have a thickness of 5 to 200 nm over the insulating film 183 by a plasma CVD method using $SiH_4$ and $H_2$ as source gases.

Next, heat treatment is performed in an electric furnace at 500° C. for an hour, and then at 550° C. for four hours in order to discharge hydrogen from the amorphous silicon films 182 and 184.

Next, as shown in FIG. 10B, the amorphous silicon films 182 and 184 are irradiated with laser light 185, scanned with the laser light 185. A beam spot of the laser light 185 is shaped into a linear form with an optical system. The amorphous silicon films 182 and 184 are melted completely by being irradiated with the laser light 185, and portions irradiated with the laser light 185 become liquid-phase silicon 186 and liquid-phase silicon 187, respectively.

By being scanned with the laser light 185, the silicon that is melted completely grows laterally, so that crystalline silicon 188 including a crystal with a large grain diameter is formed. Further, crystalline silicon 189 is formed in the amorphous silicon film 184 of an upper layer.

Next, the amorphous silicon film 184, in which the crystalline silicon 189 is formed, and the insulating film 183 are removed by etching. Then, a resist mask is formed through exposure and development. Using the mask, the amorphous silicon film 182, in which the crystalline silicon 188 is formed, is shaped into a desired form by a dry etching method at a flow ratio of $SF_6:O_2=4:15$, so that island-shaped semiconductor layers 201 to 203 are formed, as shown in FIG. 10C. The semiconductor layers 201 to 203 are formed of the crystalline silicon 188.

Next, as shown in FIG. 10D, an insulating film with a single-layer or stacked-layer structure is formed over the semiconductor layers 201 to 203. This insulating film forms a gate insulating film of thin film transistors. In this embodiment, a silicon oxynitride film 204 is formed to have a thickness of 115 nm as the insulating film by a plasma CVD method.

Next, as shown in FIG. 10D, gate electrodes 205 to 208 are formed over the semiconductor layers 201 to 203 with the silicon oxynitride film 204 interposed therebetween. In this embodiment, the gate electrodes 205 to 208 are formed in the following manner: stacked layers of a tantalum nitride film with a thickness of 30 nm and a tungsten film with a thickness of 370 nm are formed over the silicon oxynitride film 204 by a sputtering method; and these stacked layers are etched using a resist mask formed through a photolithography process, so that the gate electrodes 205 to 208 with a structure in which edge portions of tantalum nitride films 200a of lower layers extend beyond edge portions of tungsten films 200b of upper layers are formed.

Next, using the gate electrodes 205 to 208 as masks, as shown in FIG. 11A, an n-type impurity element or a p-type impurity element is added to the semiconductor layers 201 to 203, so that high-concentration impurity regions 209 to 215 and low-concentration impurity regions 216 to 223 are formed. With the use of the gate electrodes 205 to 208 with a stacked-layer structure of the tantalum nitride film 200a and the tungsten film 200b as masks, the low-concentration impurity regions 216 to 223 are formed overlapping with the tantalum nitride films 200a, which form the lower layers of the gate electrodes 205 to 208, with the silicon oxynitride film 204 interposed therebetween.

In this embodiment, in order to form a p-channel thin film transistor 225 using the semiconductor layer 201, the semiconductor layer 201 is doped with boron (B), which is a p-type impurity element, so that the p-type high-concentration impurity regions 209 and 210 and the p-type low-concentration impurity regions 216 and 217 are formed. Further, in order to form n-channel thin film transistors 226 and 227 using the semiconductor layers 202 and 203, the semiconductor layers 202 and 203 are doped with phosphorus (P), which is an n-type impurity element, so that the n-type high-concentration impurity regions 211 to 215 and the n-type low-concentration impurity regions 218 to 223 are formed. Furthermore, channel formation regions 201c to 203c are formed in a self-aligned manner by doping the semiconductor layers 201 to 203 with the impurity elements.

After that, heat treatment is performed at 550° C. for four hours in a nitrogen atmosphere in order to activate the impurity elements added to the semiconductor layers 201 to 203.

Next, as shown in FIG. 11B, a silicon oxide film 231, a silicon nitride film 232, and a silicon oxide film 233 are stacked over the thin film transistors 225 to 227.

Next, a resist mask is formed through a photolithography process. The silicon oxynitride film 204, the silicon oxide film 231, the silicon nitride film 232, and the silicon oxide film 233 are etched using the mask, so that contact holes are formed at desired portions.

Next, a Ti film with a thickness of 100 nm, an Al film with a thickness of 700 nm, and a Ti film with a thickness of 100 nm are formed sequentially by a sputtering method, so that stacked layers are formed over the silicon oxide film 233. These stacked layers are etched using a resist mask formed through a photolithography process, so that wirings 234 to 239 and a connecting terminal 240 are formed as shown in FIG. 11C. Accordingly, the thin film transistors 225 to 227 are formed over the same glass substrate 180. The wirings 234 and 235, 236 and 237, and 238 and 239 are connected to the high-concentration impurity regions of the thin film transistors 225, 226, and 227, respectively. The connecting terminal 240 is formed in the terminal portion 263.

The n-channel thin film transistor 225 and the p-channel thin film transistor 226 are included in the drive circuit portion 264. In the drive circuit portion 264, a circuit for driving pixels, e.g., a source driver or a gate driver, is formed. Although both the n-channel transistors and the p-channel transistor are formed in the drive circuit portion in this embodiment, it is also possible to form only an n-channel transistor or only a p-channel transistor.

The n-channel thin film transistor 227 is included in the pixel portion 265 and functions as a switching element for applying voltage to an electrode of a pixel. The n-channel thin film transistor 227 includes the plurality of channel formation regions 203c in one semiconductor layer 203, and thus is a multi-channel type.

Next, as shown in FIG. 11B, a silicon oxynitride film 241 is formed to have a thickness of 100 to 150 nm over the wirings 234 to 239 and the connecting terminal 240 by a plasma CVD method. After that, the silicon oxynitride film 241 is etched using a resist mask formed through a photolithography process, so that contact holes reaching the wiring 239 of the thin film transistor 227 and the connecting terminal 240 are formed. By covering the wirings and the semiconductor elements such as the thin film transistors in the drive circuit with the silicon oxynitride film 241 as in this embodiment, contamination of the drive circuit can be avoided.

Next, as shown in FIG. 11C, a first pixel electrode 242 connected to the wiring 239 of the thin film transistor 227, and a conductive layer 244 connected to the connecting terminal 240 are formed. When the liquid crystal display device is a transmissive type, the first pixel electrode 242 is formed using a conductive film with a property of transmitting light. When the liquid crystal display device is a reflective type, the first pixel electrode 242 is formed using a conductive film with a property of reflecting light. When the liquid crystal display device is a semi-transmissive type, part of the first pixel electrode is formed using a conductive film with a property of transmitting light, and the other part is formed using a conductive film with a property of reflecting light.

In this embodiment, the liquid crystal display device is a transmissive type. An ITO film containing silicon oxide is formed to have a thickness of 125 nm by a sputtering method. The ITO film is etched using a resist mask formed through a photolithography process, so that the first pixel electrode 242 and the conductive layer 244 are formed as shown in FIG. 11C.

Next, as shown in FIG. 11C, an orientation film 243 is formed. The orientation film 243 may be formed if necessary. The orientation film 243 can be formed by forming a high molecular compound (e.g., polyimide or polyvinyl alcohol) layer by a roll coating method, a printing method, or the like and then rubbing the high molecular compound layer. It is also possible to form the orientation film 243 by depositing silicon oxide obliquely with respect to the glass substrate 180. Further, it is also possible to form the orientation film 243 by irradiating photoreactive high molecular compounds with polarized UV light, thereby polymerizing the photoreactive high molecular compounds. In this embodiment, the orientation film 243 is formed in the following manner: a high molecular compound (e.g., polyimide or polyvinyl alcohol) layer is printed, fired, and then rubbed.

Next, a glass substrate 251 which functions as a counter substrate is provided. As shown in FIG. 12A, a second pixel electrode 253 formed of a conductive film with a property of transmitting light is provided for the glass substrate 251, and an orientation film 254 is formed over the second pixel electrode 253. The second pixel electrode 253 can be formed in a similar manner to the first pixel electrode 243, and the orientation film 254 can be formed in a similar manner to the orientation film 243. In this embodiment, a coloring layer 252 which functions as a color filter is formed between the glass substrate 251 and the second pixel electrode 253. When color display is performed in an RGB method, a coloring layer in which dyes or pigments corresponding to each color, red, green, and blue are dispersed is formed as the coloring layer 252, corresponding to pixels. The coloring layer 252 can be formed if necessary.

Next, the glass substrate 180 and the glass substrate 251 are attached to each other with a sealant 257, and a liquid crystal layer 255 is formed between the glass substrate 180 and the glass substrate 251. A plurality of pixels are formed in the pixel portion 265. A liquid crystal element 258 is formed in each of the pixels, and includes the first pixel electrode 242, the second pixel electrode 253, and the liquid crystal layer 255 between these electrodes.

The crystal layer 255 can be formed by injecting a liquid crystal material into space surrounded with the glass substrate 180, the glass substrate 251, and the sealant 257 by a vacuum injection method utilizing a capillary phenomenon. It is also possible to form the liquid crystal layer 255 in the following manner: the sealant 257 is formed at one surface of the glass substrate 180 or the glass substrate 251, and a liquid crystal material is dripped into a region surrounded with the sealant 257; after that, pressure bonding of the glass substrate 180 and the glass substrate 251 is performed under low pressure, so that interstices between the glass substrates 180 and 251 are sealed with the sealant 257.

For the sealant 257, a thermosetting epoxy resin, a UV-curable acrylic resin, a thermoplastic nylon resin, a polyester resin, or the like can be used. It is preferable that the sealant 257 contain a filler in order to keep a space between the glass substrate 180 and the glass substrate 251.

In order to keep space between the glass substrate 180 and the glass substrate 251, a plurality of spacers 256 can be provided between the orientation films 243 and 254. The spacers 256 can be formed by applying an organic resin and etching the organic resin into a desired shape, typically, a columnar shape or a cylindrical shape. In this case, the spacers 256 are formed over the silicon oxide film 233 before forming the orientation film 243, and then the orientation film 243 is formed covering the spacers 256. Bead spacers may be used as the spacers 256. In this embodiment, bead spacers are used as the spacers 256. Further, although not shown in the diagrams, a polarizing plate can be provided for either or both of the glass substrate 180 and the glass substrate 251.

As shown in FIG. 12B, an FPC (a flexible printed circuit) 262 is connected to the connecting terminal 240 in the terminal portion 263 through the conductive layer 244 and an anisotropic conductive film 261. Video signals or clock signals are input into the connecting terminal 240 through the FPC 262.

Through the above steps, the liquid crystal display device can be formed. The liquid crystal display device of this embodiment can be formed using a thin film transistor including a semiconductor film with a thickness of 50 nm or smaller. The electric power consumption of the liquid crystal display device can be lowered because the thin semiconductor layer lowers the absolute value of the threshold voltage value of the thin film transistor. Consequently, the number of pixels can be increased, whereby a liquid crystal display device with high definition can be obtained. Further, functional circuits other than a source driver and a gate driver, e.g., a memory circuit and a CPU, can be formed over the glass substrate because minute thin film transistors with gate widths of 1 μm or smaller can be formed.

Embodiment 3

Figure 13A:
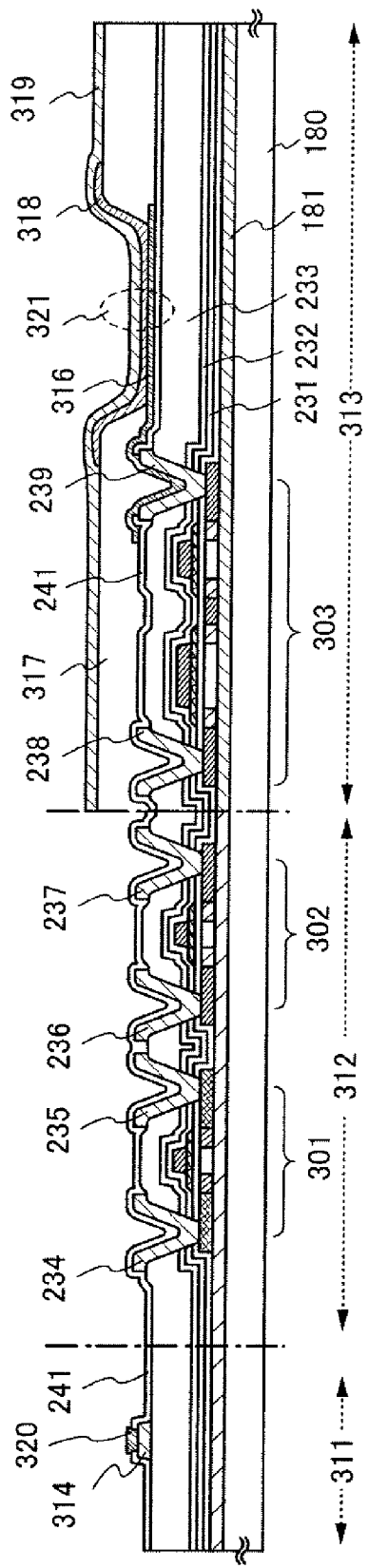
FIGS. 13A and 13B are cross-sectional views to illustrate a method for forming a semiconductor device of the present invention and a method for forming an active matrix light-emitting device.
Figure 13B:
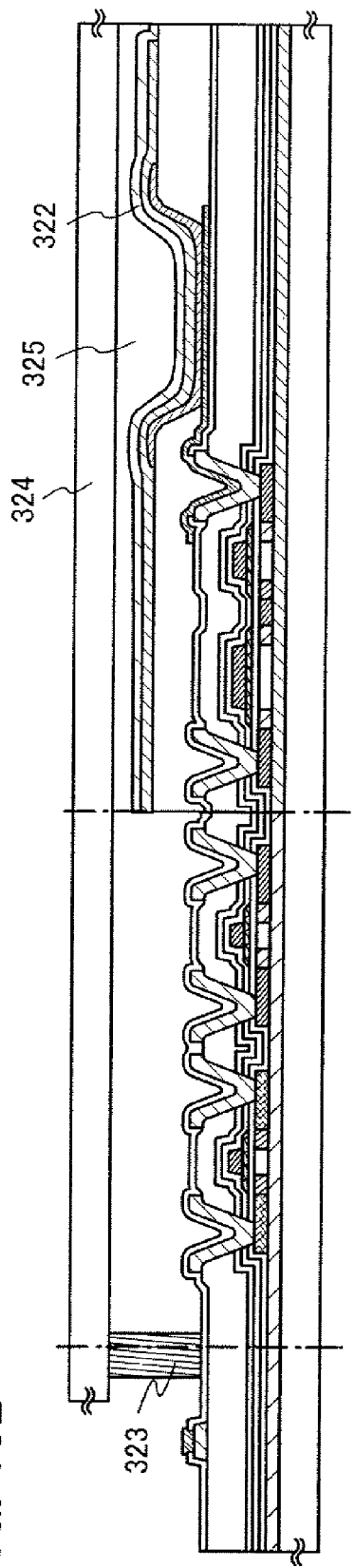
Figure 14:
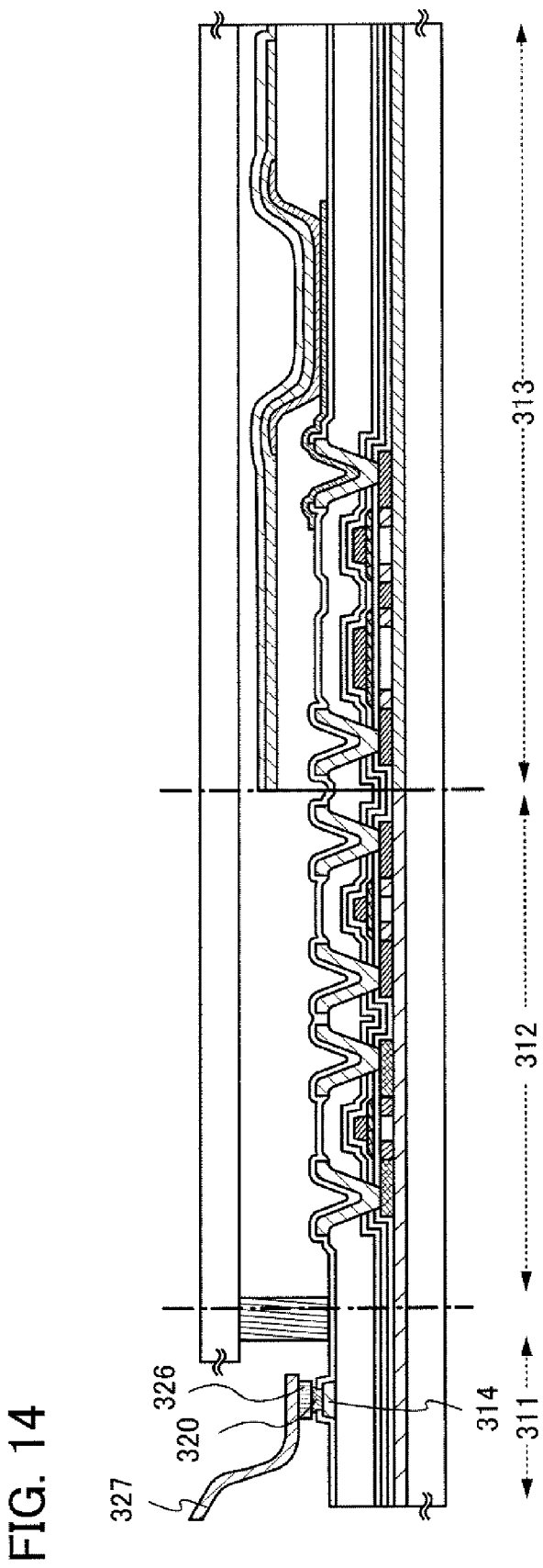
FIG. 14 is a cross-sectional view to illustrate a step following the step of FIG. 13B.

This embodiment describes a production method of a light-emitting device including a light-emitting device, which is an example of a semiconductor device, with reference to FIGS. 13A to 14. FIGS. 13A to 14 show cross-sectional structures of a terminal portion 311, a drive circuit portion 312, and a pixel portion 313.

First, as shown in FIG. 13A, thin film transistors 301 to 303 are formed over a glass substrate 180. The thin film transistors 301 to 303 can be formed in a similar manner to the thin film transistors 225 to 227 shown in FIGS. 10A to 11C in Embodiment 2. In FIG. 13A, the same reference numerals as in FIGS. 10A to 11C designate the same components.

The n-channel thin film transistor 301 and the p-channel thin film transistor 302 are included in the drive circuit portion 312. A circuit for driving pixels, such as a source driver or a gate driver, is formed in the drive circuit portion 312. Although both the n-channel transistor and the p-channel transistor are formed in the drive circuit portion 312 in this embodiment, it is also possible to form only an n-channel transistor or only a p-channel transistor.

The p-channel thin film transistor 303 is included in the pixel portion 313. Although this embodiment illustrates only one thin film transistor in a pixel, two or more thin film transistors can be provided in one pixel.

After forming a silicon oxynitride film 241, a first electrode layer 316 connected to a wiring 239 of the thin film transistor 303, and a conductive layer 320 connected to a connecting terminal 314 are formed. The first electrode layer 316 and the conductive layer 320 are formed in the following manner: an ITO film containing silicon oxide is formed to have a thickness of 125 nm by a sputtering method, and then etched selectively using a resist mask formed through a photolithography process.

Next, an organic insulator film 317 that covers edge portions of the first electrode layer 316 is formed. In this embodiment, the organic insulator film 317 is formed by applying photosensitive polyimide, performing exposure and development, and then firing the photosensitive polyimide. As a result, the organic insulator film 317 is formed without overlapping the terminal portion 311 and the drive circuit portion 312. Further, the organic insulator film 317 has an opening that expose the upper surface of the first electrode layer 316 in the pixel portion 313.

Next, a layer 318 containing a light-emitting substance is formed partly over the first electrode layer 316 and the organic insulator film 317 by a vapor deposition method. The light-emitting substance may be an organic compound with a light-emitting property or an inorganic compound with a light-emitting property. Further, it is also possible to use different light-emitting substances in the layer 318 containing the light-emitting substances in each pixel, thereby having variations in colors of light. For example, a pixel with a function of emitting red light, a pixel with a function of emitting blue light, and a pixel with a function of emitting green light are provided over the same glass substrate 180, whereby color display can be performed. Further, when a pixel with a function of emitting white light is formed in addition to pixels which emit red, blue, and green light, reduction in electric power consumed in the light-emitting device can be achieved.

As a layer containing the light-emitting substance with a property of emitting red light, stacked layers of DNTPD with a thickness of 50 nm, NPB with a thickness of 10 nm, NPB to which bis[2,3-bis(4-fluorophenyl)quinoquixalinato]iridium (acetylacetonate) (abbr.: Ir(Fdpq)$_2$(acac)) is added, with a thickness of 30 nm, Alq$_3$ with a thickness of 60 nm, and LiF with a thickness of 1 nm can be formed. As a layer containing the light-emitting substance with a property of emitting green light, stacked-layers of DNTPD with a thickness of 50 nm, NPB with a thickness of 10 nm, Alq$_3$ to which coumarin 545T (C545T) is added, with a thickness of 40 nm, Alq$_3$ with a thickness of 60 nm, and LiF with a thickness of 1 nm can be formed.

As a layer containing the light-emitting substance with a property of emitting blue light, stacked layers of DNTPD with a thickness of 50 nm, NPB with a thickness of 10 nm, 9-[4-(N-carbazolyl)]phenyl-10-phenylanthracene (abbr.: CzPA) to which 2,5,8,11-tetra(tert-butyl)perylene (abbr.: TBP) is added, with a thickness of 30 nm, Alq$_3$ with a thickness of 60 nm, and LiF with a thickness of 1 nm can be formed.

Next, a second electrode layer 319 is formed over the layer 318 containing a light-emitting substance. In this embodiment, the second electrode layer 319 is formed by depositing an Al film with a thickness of 200 nm by a vapor deposition method. In the above manner, the first electrode layer 316, the layer 318 containing a light-emitting substance, and the second electrode layer 319 are stacked, thereby functioning as a light-emitting element 321.

When a light-emitting layer composed of an organic compound is formed in the layer 318 containing a light-emitting substance, in addition to the light-emitting layer, a hole injecting layer formed of a hole injecting material, a hole transporting layer formed of a hole transporting material, an electron transporting layer formed of an electron transporting material, and an electron injecting layer formed of an electron injecting material can be formed appropriately.

As the layer 318 containing a light-emitting substance, a light-emitting layer containing an inorganic compound can also be formed. In this case, the light-emitting element 321 functions as an inorganic EL element. In this case, further, a buffer layer may be formed between the layer 318 containing a light-emitting substance and the first electrode layer 316, and/or the layer 318 containing a light-emitting substance and the second electrode layer 319. This buffer layer facilitates carrier injection.

Inorganic EL elements are classified into a dispersive inorganic EL element and a thin-film inorganic EL element depending on the element structure. There is a difference in that the former includes a layer which contains a light-emitting substance and in which particles of a light-emitting material are dispersed in a binder, and the latter includes a layer which contains a light-emitting substance and is formed of a thin film of a light-emitting material; however, they are common in that they need electrons accelerated by a high electric field. In the present invention, the structure of the inorganic EL element is not particularly limited.

After forming the light-emitting element 321, as shown in FIG. 13B, a protective film 322 is formed over the second electrode layer 319. The protective film 322 is provided in order to prevent moisture, oxygen, and the like from entering the light-emitting element 321. The protective film 322 can be formed by a method for forming a thin film, e.g., a plasma CVD method or a sputtering method, using a single-layer or stacked-layer film formed of silicon nitride, silicon oxide, silicon oxynitride, aluminum oxynitride, aluminum oxide, diamond-like carbon (DLC), carbon containing nitrogen (CN), or another insulating material.

Further, a sealing substrate 324 is attached to a second interlayer insulating film 315 formed over the glass substrate 180 with a sealant 323, so that a structure in which the light-emitting element 321 is provided in space 325, which is surrounded with the glass substrate 180, the sealing substrate 324, and the sealant 323, is obtained. The space 325 is filled with a filler, and can be filled with an inert gas (e.g., nitrogen or argon), a resin material such as the sealant 323, or the like.

It is preferable to use an epoxy-based resin for the sealant 323. Further, it is desirable that the material allow as little moisture and oxygen as possible to penetrate. As the sealing substrate 324, a resin substrate formed of FRP (fiberglass-reinforced plastics), PVF (polyvinyl fluoride), PET (polyethylene terephthalate), PEN (polyethylene naphthalate), PES (polyether sulfone), polyester-based resin, acrylic-based resin, or the like can be used as well as a glass substrate or a quartz substrate.

Next, as shown in FIG. 14, an FPC 327 is attached to the conductive layer 320 connected to the connecting terminal 314 with the use of an anisotropic conductive layer 326 in a similar manner to Embodiment 2. Through the above steps, an active matrix light-emitting device can be formed.

The light-emitting display device of this embodiment can be formed using a thin film transistor including a semiconductor film with a thickness of 50 nm or smaller. The liquid crystal display device can operate with lower electric power because the thin semiconductor layer lowers the absolute value of the threshold voltage value of the thin film transistor. Consequently, the number of pixels can be increased, whereby a liquid crystal display device with high definition can be obtained. Further, functional circuits other than a source driver and a gate driver, e.g., a memory circuit and a CPU, can be formed over the glass substrate because minute thin film transistors with gate widths of 1 μm or smaller can be formed.

Embodiment 4

This embodiment describes concrete examples of an electronic device including a semiconductor device of the present invention. This embodiment describes electronic devices including the liquid crystal display device shown in Embodiment 2 and the light-emitting device shown in Embodiment 3, in a display portion. For example, as such electronic devices, television devices (also referred to simply as "TVs", or "television receivers"), photographic devices such as digital cameras or digital video cameras, cellular phone devices (also referred to simply as "cellular phones" or "cell phones"), portable information terminals such as PDAs, portable game machines, computer monitors, computers, audio reproducing devices such as car audio components, or image reproducing devices including recording media, such as home-use game machines, can be given. Further, information indicator panels in train stations, airports, or the like; advertising indicator panels in the street; or the like can also be given.

Hereinafter, concrete examples of the electronic devices are described with reference to FIGS. 15A to 15F, which are external views of the electronic devices.

Figure 15A:
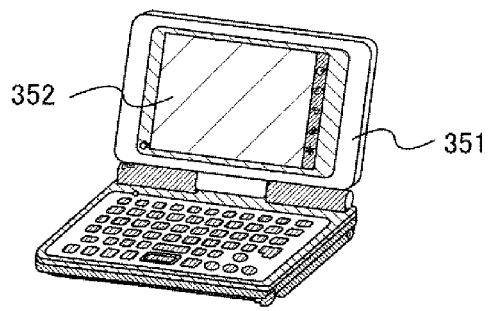
FIGS. 15A to 15F are external views of electronic devices including semiconductor devices of the present invention in display portions.

A portable information terminal shown in FIG. 15A is provided with a main body 351, a display portion 352, and the like. By applying the semiconductor device shown in Embodiments 2 and 3 to the display portion 352, the portable information terminal capable of display with high definition can be provided at a low price.

Figure 15B:
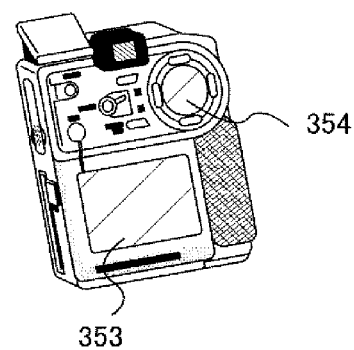

A digital video camera shown in FIG. 15B is provided with a display portion 353, a display portion 354, and the like. By applying the semiconductor device shown in Embodiments 2 and 3 to the display portion 353 or the display portion 354, the digital video camera capable of display with high definition can be provided at a low price.

Figure 15C:
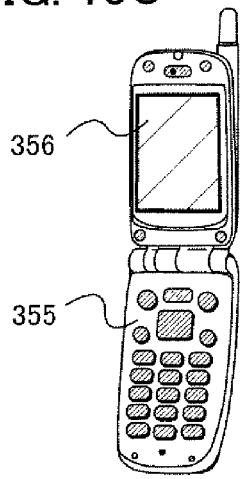

A cellular phone shown in FIG. 15C is provided with a main body 355, a display portion 356, and the like. By applying the semiconductor device shown in Embodiments 2 and 3 to the display portion 356, a portable terminal capable of display with high reliability can be provided at a low price.

Figure 15D:
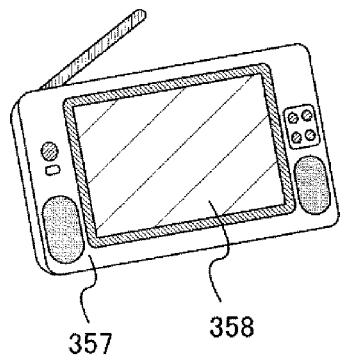

A portable television device shown in FIG. 15D is provided with a main body 357, a display portion 358, and the like. By applying the semiconductor device shown in Embodiments 2 and 3 to the display portion 358, the portable television device capable of display with high definition can be provided at a low price.

Figure 15E:
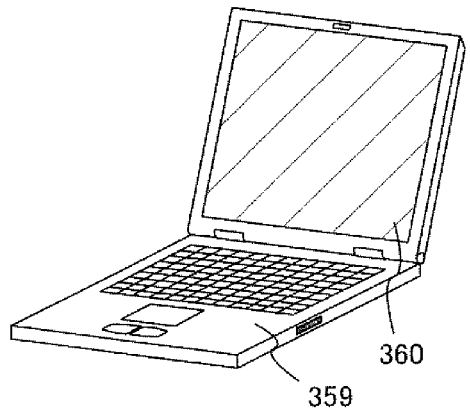

A portable computer shown in FIG. 15E is provided with a main body 359, a display portion 360, and the like. By applying the semiconductor device shown in Embodiments 2 and 3 to the display portion 360, the portable computer capable of display with high definition can be provided at a low price.

Figure 15F:
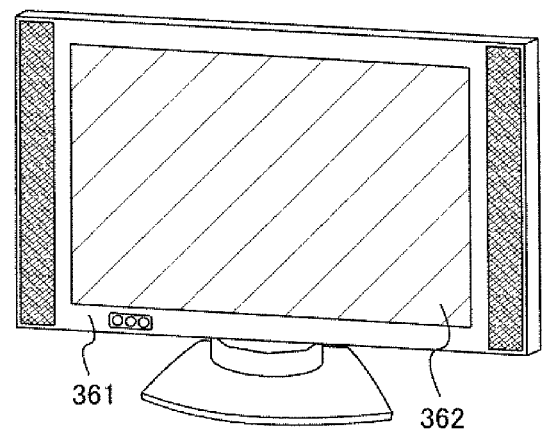

A television device shown in FIG. 15F is provided with a main body 361, a display portion 362, and the like. By applying the semiconductor device shown in Embodiments 2 and 3 to the display portion 362, the television device capable of display with high definition can be provided at a low price.

Embodiment 5

This embodiment describes examples in which the present invention is applied to a semiconductor device into/from which data can be input and output without contact. The semiconductor device into/from which data can be input and output without contact is called an "RFID tag", an "ID tag", an "IC tag", an "IC chip", an "RF tag", a "wireless tag", an "electronic tag", or a "wireless chip" depending on the usage mode.

Figure 16:
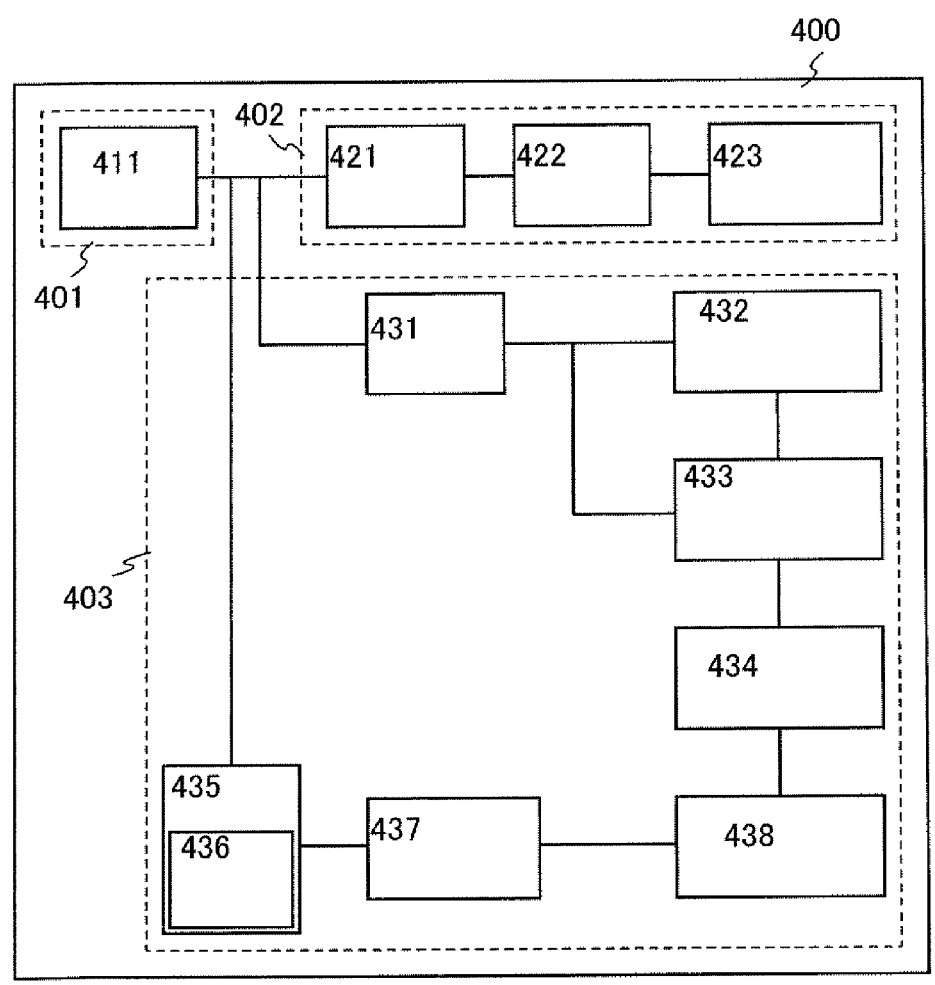
FIG. 16 is a block diagram showing a structural example of a semiconductor device capable of data communication without contact.

First, with reference to FIG. 16, a structure of the semiconductor device capable of data communication without contact is described. FIG. 16 is a block diagram showing a structural example of the semiconductor device capable of data communication without contact. A semiconductor device 400 of this embodiment includes an antenna portion 401, a power supply portion 402, and a logic portion 403 if broadly divided.

The antenna portion 401 includes an antenna 411 for receiving external signals and transmitting data. The antenna portion 401 is provided with the antenna 411 best suited to a signal communication method of the semiconductor device 400. As the signal communication method of the semiconductor device 400, an electromagnetic coupling method, an electromagnetic induction method, a microwave method, or the like can be used. The communication method is determined by an operator in consideration of the usage.

The power supply portion 402 includes a rectifier circuit 421, a storage capacitor 422, and a constant voltage circuit 423. The rectifier circuit 421 generates voltage from a radio wave received in the antenna portion 401. The storage capacitor 422 stores the voltage generated in the rectifier circuit 421. The constant voltage circuit 423 makes the voltage generated in the rectifier circuit 421 have constant value.

The logic portion 403 includes a demodulation circuit 431, a clock generation and correction circuit 432, a code recognition and judgment circuit 433, a memory controller 434, a modulation circuit 435, an encoding circuit 437, and a mask ROM 438 for storing data.

The demodulation circuit 431 demodulates a received signal. The clock generation and correction circuit 432 generates a clock signal and corrects the clock signal.

The code recognition and judgment circuit 433 recognizes a code included in a received signal and makes a judgment. A code which is recognized and judged by the code recognition and judgment circuit 433 is an end of frame (EOF) signal, a start of frame (SOF) signal, a flag, a command code, a mask length, a mask value, or the like. Further, the code recognition and judgment circuit 433 has a function of cyclic redundancy check, with which a transmission error is identified. The modulation circuit 435 includes a modulation resistor 436.

The memory controller 434 generates a signal for reading out data from a memory such as the mask ROM 438, based on a received signal. The modulation circuit 435 includes the modulation resistor 436, and makes an encoded signal included in a transmission signal. The encoding circuit 437 encodes data (which is read out from a memory, for example).

A feature of the semiconductor device 400 of this embodiment is that it is a flexible device, which can be bent or warped. The various circuits and the antenna included in the semiconductor device 400 are fixed not to the substrate used in forming the circuits but to another flexible substrate.

Hereinafter, with reference to FIGS. 17A to 23B, a method for forming the semiconductor device 400 including the antenna portion 401, the power supply portion 402, and the logic portion 403 is described. FIGS. 17A to 23B are cross-sectional views illustrating a method for forming the semiconductor device of this embodiment. In FIGS. 17A to 23B, thin film transistors are shown as a typical component of the power supply portion 402 and the logic portion 403. In the power supply portion 402 and the logic portion 403, various elements such as a diode, a resistor element, a capacitor element, and a memory element are formed in addition to the thin film transistors in accordance with the function of the circuit.

A glass substrate 500 is used for a substrate over which a thin film transistor and the like are formed. As shown in FIG. 17A, a separation film 501 including three layers 501a to 501c is formed over the glass substrate 500. As the first layer 501a, a silicon oxynitride film ($SiO_xN_y$, x>y) is formed to have a thickness of 100 nm with a parallel plate plasma CVD apparatus and using $SiH_4$ and $N_2O$ for source gases. As the second layer 501b, a tungsten film is formed to have a thickness of 30 nm with a sputtering apparatus. As the third layer 501c, a silicon oxide film is formed to have a thickness of 200 nm with a sputtering apparatus.

By forming the third layer 501c (silicon oxide), a surface of the second layer 501b (tungsten) is oxidized, whereby a tungsten oxide is formed at an interface. Formation of the tungsten oxide facilitates separation of the glass substrate 500 from a circuit in interposing the circuit including a semiconductor element to another substrate in a later step. The first layer 501a retains adhesion of the second layer 501b during forming an element formation layer.

Other than tungsten (W), the second layer 501b can be formed using a metal element such as molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or a compound of these metal elements. The second layer 501b can have a thickness of 20 to 40 nm inclusive.

As show in FIG. 17A, an insulating film 502 with a two-layer structure is formed over the separation film 501. As a first film 502a, a silicon oxynitride film ($SiO_xN_y$, x<y) is formed to have a thickness of 50 nm with a plasma CVD apparatus and using $SiH_4$, $N_2O$, $NH_3$, and $H_2$ for source gases. The first layer 502a is made to contain nitrogen at a composition rate of 40% or more to enhance a barrier property. As a second layer 502b, a silicon oxynitride film ($SiO_xN_y$, x>y) is formed to have a thickness of 100 nm with a parallel plate plasma CVD apparatus and using $SiH_4$ and $N_2O$ for source gases. The second layer 502b contains nitrogen at a composition rate of 0.5% or less.

As shown in FIG. 17B, an amorphous silicon film 503 is formed over the insulating film 502. The amorphous silicon film 503 is formed to have a thickness of 5 to 50 nm inclusive with a parallel plate plasma CVD apparatus and using $SiH_4$ and $H_2$ for source gases. An insulating film 504 with a single-layer structure is formed over the amorphous silicon film 503. In this embodiment, as the insulating film 504, a silicon oxynitride film ($SiO_xN_y$, 0<y<x) is formed to have a thickness of 10 to 200 nm inclusive with a parallel plate plasma CVD apparatus and using $SiH_4$ and $N_2O$ for source gases. An amorphous silicon film 505 is formed to have a thickness of 30 to 200 nm inclusive over the insulating film 504 by a parallel plate plasma CVD method using $SiH_4$ and $H_2$ for source gases.

Next, heat treatment is performed in an electric furnace at 500° C. for an hour, and then at 550° C. for four hours in order to discharge hydrogen from the amorphous silicon films 503 and 505.

Next, the amorphous silicon films 503 and 505 are irradiated with laser light. A beam spot of the laser light is shaped into a linear form with an optical system. The amorphous silicon films 503 and 505 are melted completely by being irradiated with the laser light. By being scanned and irradiated with the laser light, the silicon that is melted completely in the amorphous silicon film 503 grows laterally, so that crystalline silicon 508 including a crystal with a large grain diameter is formed. Further, crystalline silicon 509 is formed in the amorphous silicon film 505 of an upper layer (see FIG. 17C).

The amorphous silicon film 505 in which the crystalline silicon 509 is formed is removed by etching. Next, the crystalline silicon 509 is divided into each element, so that semiconductor layers 511 to 514 are formed and the insulating film 504 is left only at the upper surface of the semiconductor layer 514, as shown in FIG. 18A. The insulating film 504 forms a gate insulating film of the thin film transistor. In each of the semiconductor layers 511 to 513, a channel formation region, a source region, and a drain region of the thin film transistor are formed. The semiconductor layer 514 forms an electrode of a MIS-type capacitor.

An example of a method for shaping the insulating film 504 and the crystalline silicon 508 is as follows: first, a resist with a predetermined shape is formed over the insulating film 504 through a photolithography process; using the resist as a mask, the insulating film 504 and the crystalline silicon 508 is etched, so that stacked films of the semiconductor layers 511 to 514 and the insulating film 504 are formed; then, the insulating film 504 over the semiconductor layers 511 and 513 is removed using another resist mask.

Next, as shown in FIG. 18B, an insulating film 515 is formed over the entire glass substrate 500. The insulating film 515 functions as a gate insulating film of the thin film transistors and a dielectric of the capacitor. In this embodiment mode, as the insulating film 515, a silicon oxynitride film ($SiO_xN_y$, x>y) is formed to have a thickness of 20 to 40 nm inclusive with a plasma CVD apparatus and using $SiH_4$ and $N_2O$ for source gases.

As shown in FIG. 18C, a resist R1 is formed through a photolithography process, and then an n-type impurity element is added to the entire semiconductor layer 514 of the capacitor, so that an n-type impurity region 516 is formed. The n-type impurity region 516 functions as an electrode of the capacitor. The addition of the n-type impurity element is performed with an ion doping apparatus and using phosphine ($PH_3$) diluted with hydrogen for a doping gas. In this embodiment, addition of an n-type impurity element is performed in the above manner.

Next, a conductive film is formed over the insulating film 515. The conductive film forms gate electrodes of the thin film transistors, or the like. In this embodiment, the conductive film has a multi-layer structure including two layers. The first layer is formed of tantalum nitride with a thickness of 30 nm, and the second layer is formed of tungsten with a thickness of 370 nm. The tantalum nitride and the tungsten each are deposited with a sputtering apparatus. A resist is formed over the conductive film through a photolithography process, and the conductive film is etched using an ICP (inductively coupled plasma) etching apparatus as an etching apparatus. As an etching gas, first, a mixed gas of $Cl_2$, $SF_6$, and $O_2$ is used in order to etch the tungsten; next, the etching gas to put into a process chamber is changed to a $Cl_2$ gas only, and the tantalum nitride is etched. Through etching in such a manner, as shown in FIG. 19A, first conductive films 521 to 524 overlapping with the semiconductor layers 511 to 514 are formed with the insulating film 515 interposed therebetween.

The first conductive films 521 to 523 function as gate electrodes of the thin film transistors or gate wirings. In a high voltage-resistant n-channel thin film transistor, the conductive film 523 is formed so that the high voltage-resistant n-channel thin film transistor has a larger gate width (a channel length) than that of other thin film transistors. The first conductive film 524 forms the other electrode of the capacitor.

As shown in FIG. 19A, a resist R2 is formed through a photolithography process. The semiconductor layers 512 and 513 of n-channel thin film transistors are doped with an n-type impurity element. The first conductive film 522 functioning as a mask, n-type low-concentration impurity regions 525 and 526 are formed in a self-aligned manner in the semiconductor layer 512. Further, the first conductive film 523 functioning as a mask, n-type low-concentration impurity regions 527 and 528 are formed in a self-aligned manner in the semiconductor layer 513. The addition of the n-type impurity element is a step for forming LDD regions in the n-channel thin film transistors. It is preferable that the n-type low-concentration impurity regions 525 to 528 contain the n-type impurity element at a concentration of $1\times10^{16}$ to $5\times10^{18}$ atoms/cm$^3$ inclusive.

After removing the resist R2, as shown in FIG. 19B, a resist R3 is formed through a photolithography process. Then, the semiconductor layer 511 of a p-channel thin film transistor is doped with a p-type impurity element: concretely, the semiconductor layer 512 is doped with boron by an ion doping apparatus using diborane ($B_2H_6$) diluted with hydrogen as a doping gas. In this embodiment, addition of a p-type impurity element is performed in the above manner. After doping, the resist R3 is removed.

The first conductive film 521 functioning as a mask, p-type high-concentration impurity regions 529 and 530 are formed in a self-aligned manner in the semiconductor layer 511. Further, in the semiconductor layer 511, a region overlapping with the first conductive film 521 becomes a channel formation region 511c in a self-aligned manner.

As shown in FIG. 19C, insulating layers 531 to 534 are formed around the first conductive films 521 to 524. The insulating layers 531 to 534 are called "sidewalls" or "sidewall portions." The insulating layers 531 to 534 are formed of insulating films of a two-layer structure. The insulating layers 531 to 534 are formed in the following manner: first, a silicon oxynitride film ($SiO_xN_y$, x>y) is formed to have a thickness of 100 nm with a plasma CVD apparatus and using $SiH_4$ and $N_2O$ for source gases; next, a silicon oxide film is formed to have a thickness of 200 nm with an LPCVD apparatus and using $SiH_4$ and $N_2O$ for source gases; the silicon oxynitride film and the silicon oxide film are anisotropically etched by dry etching; thus, the insulating layers 531 to 534 are formed. Through this series of steps, the insulating films 515 and 504 formed of silicon oxynitride are also etched, and in the insulating film 515, portions overlapping with the first conductive films 521 to 524 and the insulating layers 531 to 534, and in the insulating film 504, a portion overlapping with the first conductive film 523 and the insulating layer 533 are left.

As shown in FIG. 20A, a resist R4 is formed through a photolithography process. The semiconductor layers 512 and 513 of the n-channel thin film transistors and the semiconductor layer 514 of the capacitor are doped with an n-type impurity element, so that n-type high-concentration impurity regions 536 to 541 are formed. The first conductive film 522 and the insulating layer 532 functioning as masks, the n-type low-concentration impurity regions 525 and 526 (see FIG. 19A) are further doped with the n-type impurity element, so that the n-type high-concentration impurity regions 536 and 537 are formed in a self-aligned manner in the semiconductor layer 512. In the semiconductor layer 512, a region overlapping with the first conductive film 522 becomes a channel formation region 512c in a self-aligned manner. Further, in the n-type low-concentration impurity regions 525 and 526, regions overlapping with the insulating layer 532 remain as n-type low-concentration impurity regions 542 and 543.

In a similar manner to the semiconductor layer 512, in the semiconductor layer 513, the n-type high-concentration impurity regions 538 and 539, a channel formation region 513c, and n-type low-concentration impurity regions 544 and 545 are formed.

The first conductive film 524 and the insulating layer 534 functioning as masks, the n-type impurity region 516 is further doped with the n-type impurity element, so that the n-type high-concentration impurity regions 540 and 541 are formed in a self-aligned manner in the semiconductor layer 514. In the semiconductor layer 514, a region overlapping with the first conductive film 524 and the insulating layer 534 remains as an n-type impurity region 546.

It is preferable that phosphorus be added for the doping with the n-type impurity element so that the n-type high-concentration impurity regions 536 to 539 of the n-channel thin film transistors contain phosphorus at a concentration of $1 \times 10^{20}$ to $2 \times 10^{21}$ atoms/cm³ inclusive.

The resist R4 is removed, and a cap insulating film 550 is formed as shown in FIG. 20B. In this embodiment, as the cap insulating film 550, a silicon oxynitride film ($SiO_xN_y$, x>y) is formed to have a thickness of 50 nm with a parallel plate plasma CVD apparatus. As source gases of the silicon oxynitride film, $SiH_4$ and $N_2O$ are used. After forming the cap insulating film 550, heat treatment is performed in a nitride atmosphere at 550° C., whereby the n-type impurity element and the p-type impurity element added to the semiconductor layers 511 to 514 are activated.

Next, a first interlayer insulating film 551 with a two-layer structure is formed. As a first layer, a silicon oxynitride film ($SiO_xN_y$, x<y) is formed to have a thickness of 100 nm with a parallel plate plasma CVD apparatus and using $SiH_4$ and $N_2O$ for source gases. As a second layer, a silicon oxynitride film ($SiO_xN_y$, x>y) is formed to have a thickness of 600 nm with a parallel plate plasma CVD apparatus and using $SiH_4$, $N_2O$, $NH_3$, and $H_2$ for source gases.

Desired portions of the first interlayer insulating film 551 and the cap insulating film 550 are removed through a photolithography process and a dry etching process, so that contact holes are formed. A conductive film is formed over the first interlayer insulating film 551. In this embodiment, the conductive film has a four-layer structure. From beneath, a Ti layer with a thickness of 60 nm, a titanium nitride layer with a thickness of 40 nm, a pure aluminum layer with a thickness of 500 nm, and a Ti layer with a thickness of 100 nm are stacked in this order. Each layer is formed with a sputtering apparatus. The conductive film is shaped into a desired form through a photolithography process and a dry etching process, so that second conductive films 552 to 563 are formed.

In order to illustrate that the second conductive films and the first conductive films are connected to each other, the diagrams show as if the second conductive films and the first conductive films were connected to each other over the semiconductor layers. However, in reality, contact portions of the second conductive films and the first conductive films do not overlap with the semiconductor layers.

The n-type high-concentration impurity region 540 and the n-type high-concentration impurity region 541 are connected to each other through the second conductive film 561. With this connection structure, the MIS-type capacitor with a stacked-structure including the n-type impurity region 546, the insulating film 515, and the first conductive film 524 is formed. The second conductive film 563 is a terminal and is connected to the antenna 411.

Figure 21:
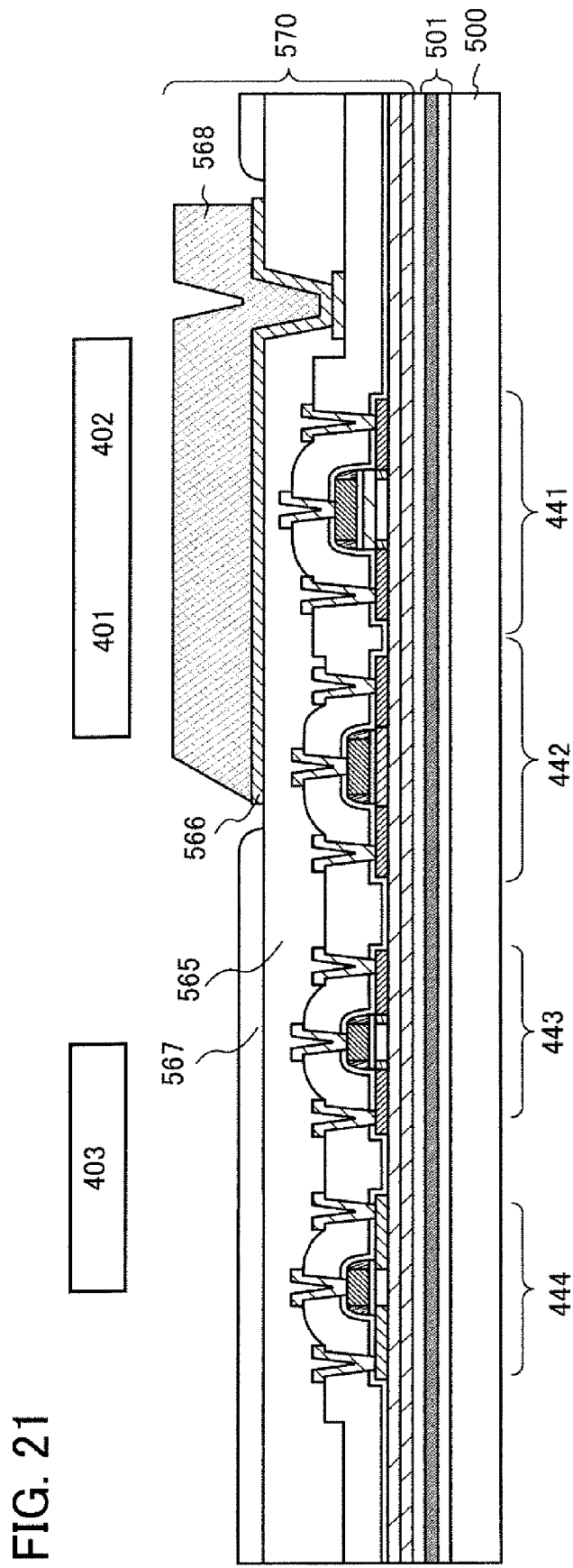
FIG. 21 is a cross-sectional view to illustrate a step following the step of FIG. 20B.

As shown in FIG. 21, a second interlayer insulating film 565 is formed. A contact hole reaching the second conductive film 563 is formed through the second interlayer insulating film 565. An example in which the second interlayer insulating film 565 is formed using photosensitive polyimide is as follows: polyimide in a liquid phase is applied with a thickness of 1.5 μm using a spinner; the polyimide is exposed to light and developed through a photolithography process, so that polyimide with the contact hole is formed; after the development, the polyimide is fired.

Next, a conductive film is formed over the second interlayer insulating film 565. The conductive film is shaped into a desired form through a photolithography process and an etching process, so that a third conductive film 566 is formed. The third conductive film 566 is a bump for connecting the antenna 411 to the second conductive film 563. In this embodiment, the third conductive film 566 is formed of Ti and has a thickness of 100 nm.

Next, a third interlayer insulating film 567 is formed. In this embodiment, the third interlayer insulating film 567 is formed using photosensitive polyimide in a similar manner to the second interlayer insulating film 565. An opening is formed through the third interlayer insulating film 567 in a region where the antenna 411 is formed.

Next, a fourth conductive film 568 which functions as the antenna 411 is formed. Aluminum is deposited using a metal mask with a vapor deposition apparatus, so that the fourth conductive film 568 with a predetermined shape is formed.

Through the steps shown in FIGS. 17A to 21, the antenna portion 401 including the fourth conductive film 568, the power supply portion 402 including a high voltage-resistant n-channel thin film transistor 441 and a capacitor 442, and the logic portion 403 including an n-channel thin film transistor 443 and a p-channel thin film transistor 444 are formed. In this embodiment, the high voltage-resistant thin film transistor 441 has a gate insulating film with a stacked-layer structure including the insulating film 504 used for crystallization of the amorphous silicon film 503, and the insulating film 515; therefore, voltage resistance of the gate insulating film can be improved.

Next, a process of separating the antenna portion 401, the power supply portion 402, and the logic portion 403 from the glass substrate 500 and transposing the separated portions to a flexible substrate is described. In the following explanation, a structure which is stacked over the separation film 501 is referred to as an element formation layer 570.

Figure 22A:
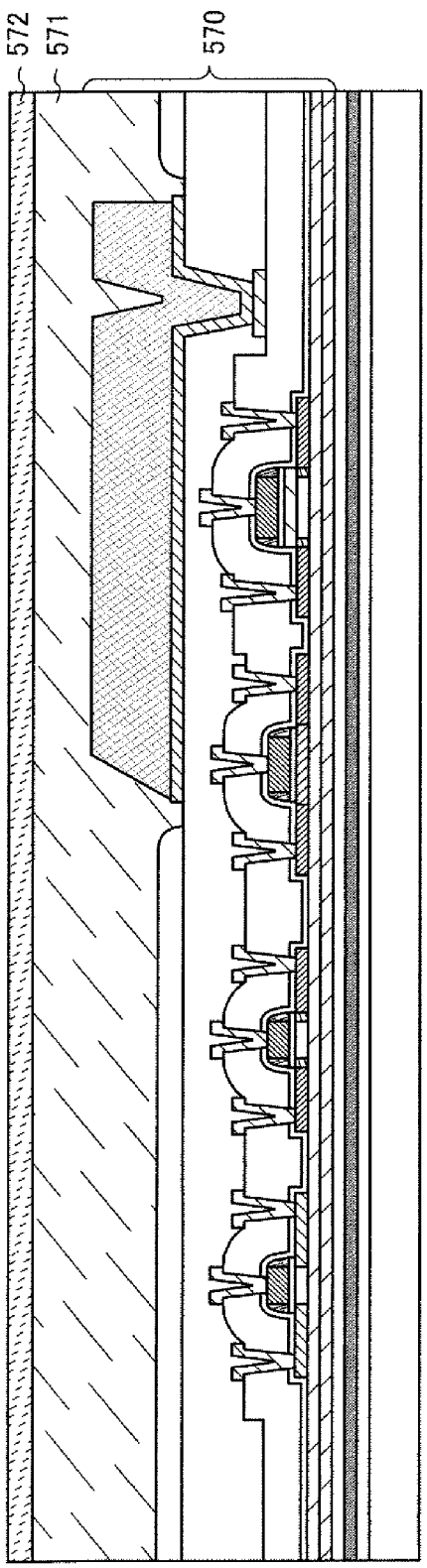
FIGS. 22A and 22B are cross-sectional views to illustrate steps following the step of FIG. 21.

First, as shown in FIG. 22A, an insulating film 571 is formed to have a thickness of 1 to 20 μm inclusive, preferably, 5 to 10 μm inclusive in order to protect the upper surface of the element formation layer 570. In this embodiment, the insulating film 571 is formed using an epoxy resin. In this case, the epoxy resin in a liquid phase is applied by a spin coating method and heated at 160° C. for 30 minutes, so that the epoxy resin is solidified.

Next, a supporting base material 572 is provided over the insulating film 571. The supporting base material 572 supports the element formation layer 570 separated from the glass substrate 500, and is separated from the element formation layer 570 later. Therefore, it is preferable to use a material which can be peeled easily for the supporting base material 572. As the supporting base material 572, for example, a base material having a property in which adhesion is strong in a normal state but becomes weak when heat is applied or is irradiated with light is preferably used. For example, a thermal peeling tape, whose adhesion becomes weak by heating, a UV peeling tape, whose adhesion becomes weak by ultraviolet irradiation, or the like is preferably used. As the supporting base material 572, a weak adhesion tape with weak adhesion in a normal state, or the like can also be used.

Figure 22B:
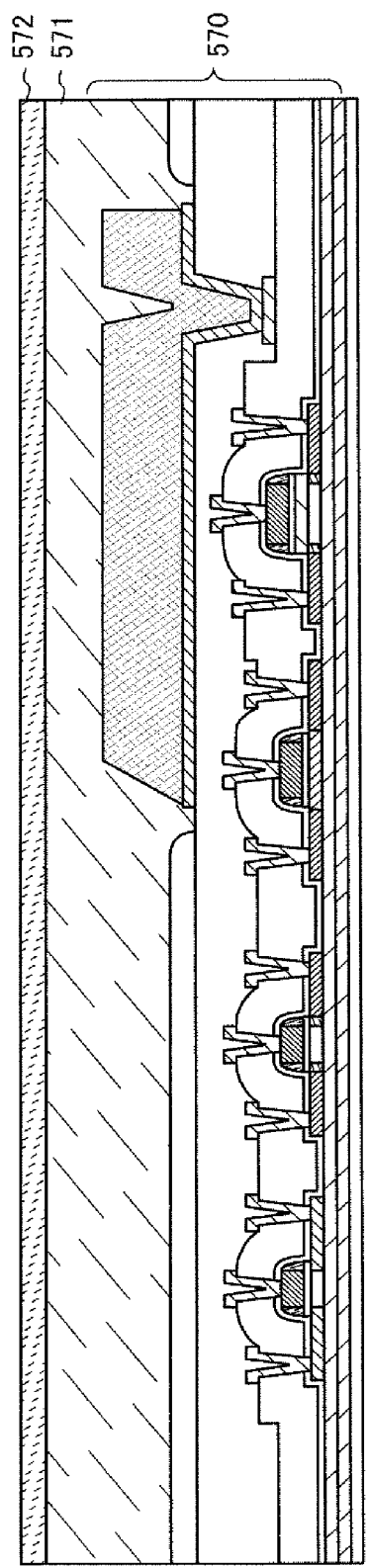

Next, in order to facilitate a later separation step, a groove is formed though the supporting base material 572, the insulating film 571, and the element formation layer 570 with the use of laser light. The groove is formed getting around the elements and the antenna that form the semiconductor device 400. With the formation of the groove, there arises separation in interface between the second layer 501b and the third layer 501c of the separation film 501. Dynamic force is applied to the element formation layer 570 or the glass substrate 500, so that the separation of the separation film 501 proceeds and the element formation layer 570 is separated from the glass substrate 500 as shown in FIG. 22B. The element formation layer 570 can be separated from the glass substrate 500 typically by being pulled off by a human hand or a gripping tool, or using a separation apparatus having a roller.

In this embodiment, a method in which the separation film 501 is formed in order to separate the element formation layer 570 from the glass substrate 500 is used. However, a method in which the separation film 501 is not formed can also be employed. For example, such methods can be employed: after the step of FIG. 21, the glass substrate 500 is mechanically ground and polished to be removed; or the glass substrate 500 is dissolved using a solution of, e.g., HF.

Figure 23A:
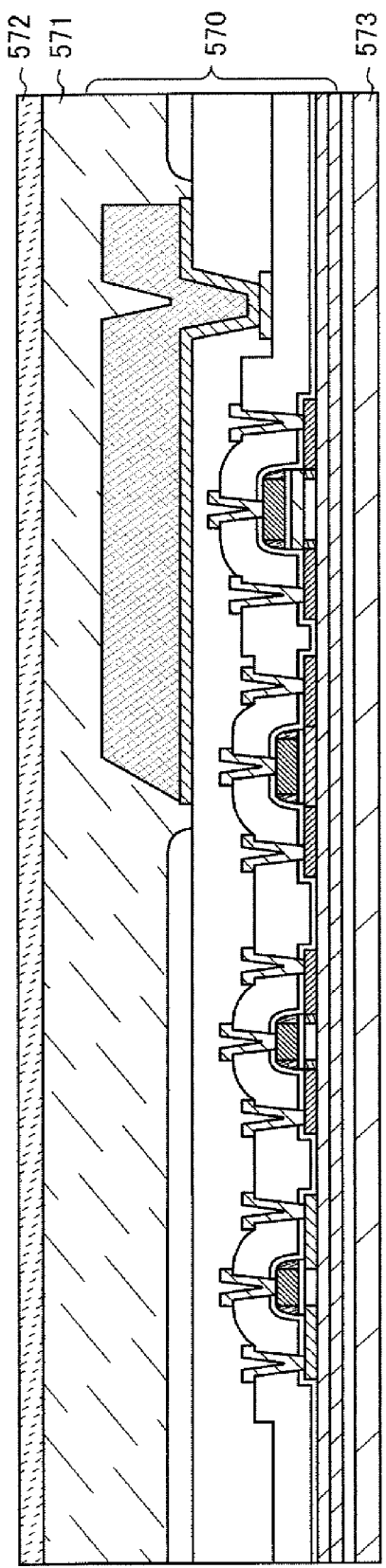
FIGS. 23A and 23B are cross-sectional views to illustrate steps following the step of FIG. 22B.

Next, as shown in FIG. 23A, a flexible substrate 573 is attached to the lower surface of the element formation layer 570, and then the supporting base material 572 is peeled off the element formation layer 570. In this embodiment, a film formed using polyaniline by a cast method is used as the flexible substrate 573.

Figure 23B:
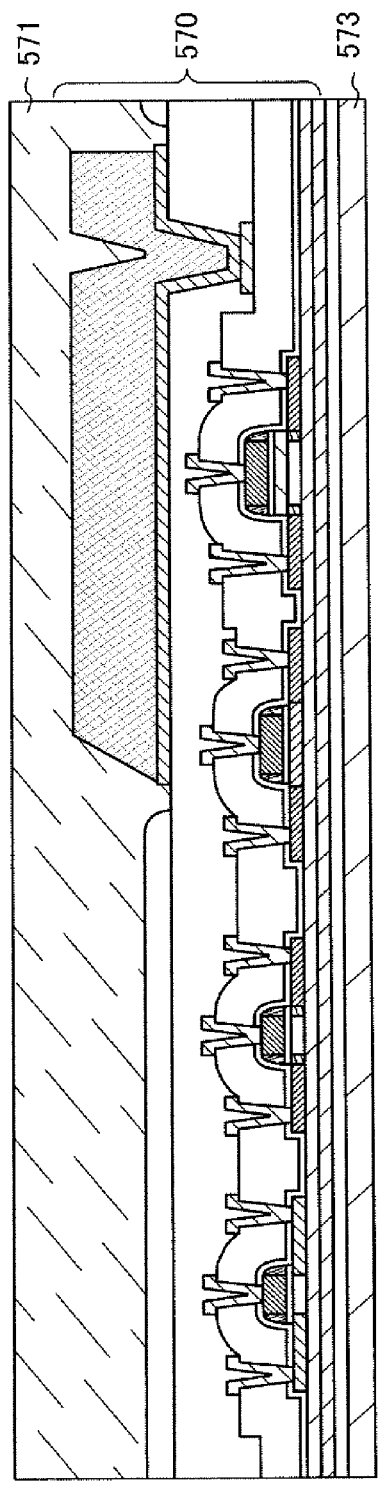
Figure 24A:
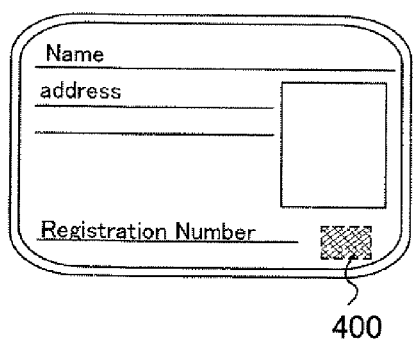
FIGS. 24A to 24F are external views of articles including semiconductor devices capable of data communication without contact.
Figure 24B:
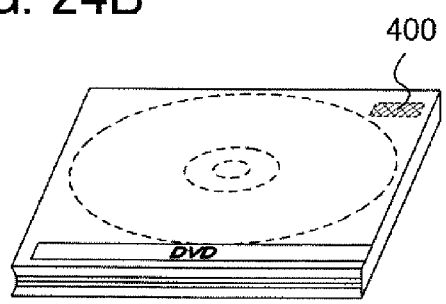
Figure 24C:
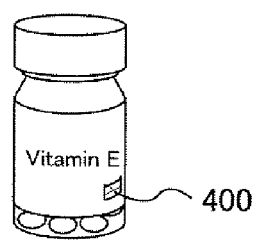
Figure 24D:
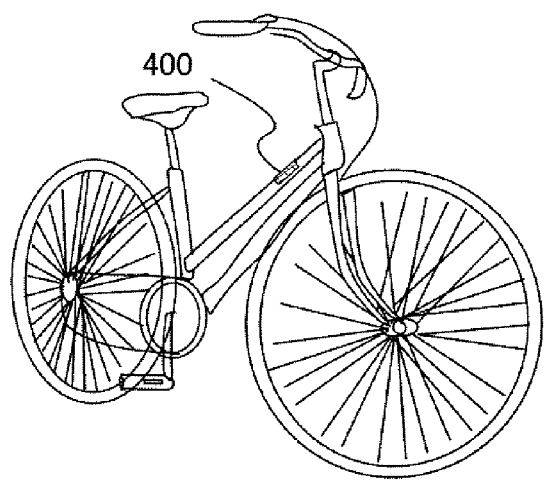
Figure 24E:
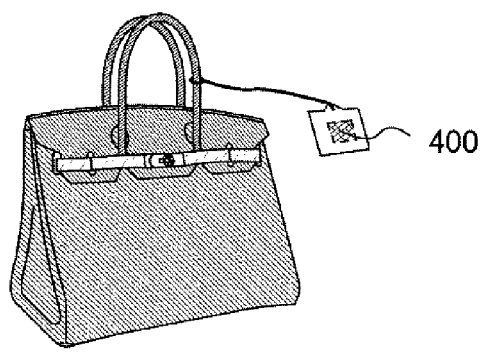
Figure 24F:
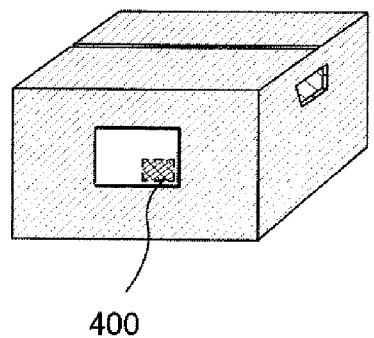

Next, as shown in FIG. 23B, the element formation layer 570 is divided into separate pieces of the semiconductor device 400 by a laser cut method. Although the element formation layer 570 is divided by a laser cut method in this embodiment mode, a dicing method, a scribing method, or the like can also be employed. Through the above steps, as shown in FIG. 23B, the semiconductor device 400 capable of data communication without contact can be formed.

This embodiment described an example in which the antenna 411 is formed along with the power supply portion 402 and the logic portion 403 over the glass substrate 500. However, forming the antenna 411 can be omitted. In this case, an antenna may be provided for a flexible substrate and attached to the bump of the element formation layer 570 so as to be connected electrically thereto.

The semiconductor device 400 of this embodiment functions as a wireless chip, and is small-sized, low-profile, light-weight, and flexible. Therefore, even when the semiconductor device 400 is attached to an article, appearance, design, and quality thereof can be preserved.

The semiconductor device 400 shown in FIG. 23B is fixed to an article by being mounted on a printed substrate, attached to a surface of the article, or embedded in the article. Further, when the semiconductor device 400 shown in FIG. 23B is incorporated into paper, and bills, securities, bearer bonds, or certificates are made using the paper, an identification function can be provided, so that forgery thereof can be prevented.

An IC card can be made by incorporating the semiconductor device 400 of FIG. 23B in this state into paper or sandwiching the semiconductor device 400 of FIG. 23B in this state between two plastic substrates. The semiconductor device 400 can have higher mechanical strength and higher water-resistance by, for example, attaching another flexible substrate to the upper surface of the insulating film 571.

Usage methods of the semiconductor device 400 are described with reference to FIGS. 24A to 24F. A wireless chip can be employed for a variety of usage and can be used by being provided for objects such as bills, coins, securities, bearer bonds, certificates (driver's licenses, resident cards, and the like; see FIG. 24A), containers for wrapping objects (wrapping paper, bottles, and the like; see FIG. 24C), recording media (DVD software, video tapes, and the like; see FIG. 24B), vehicles (bicycles and the like; see FIG. 24D), personal belongings (bags, glasses, and the like), foods, plants, animals, human bodies, clothes, daily necessities, products such as electronic devices, or tags of baggage (see FIGS. 24E and 24F).

This application is based on Japanese Patent Application serial no. 2007-044044 filed with Japan Patent office on Feb. 23, 2007, the entire contents of which are hereby incorporated by reference.

What is claimed is:

1. A method for forming a semiconductor device comprising:
    forming a first buffer film over a substrate;
    forming a first semiconductor film over the first buffer film;
    forming a second buffer film over the first semiconductor film;
    forming a light absorption film over the second buffer film; and
    performing irradiation with light from above the light absorption film to form a crystalline semiconductor in the first semiconductor film by melting the first semiconductor film and the light absorption film.

2. The method according to claim 1, wherein the light absorption film has a thickness of 30 to 200 nm inclusive.

3. The method according to claim 1, wherein the first semiconductor film has a thickness of 50 nm or smaller.

4. The method according to claim 1, wherein the first semiconductor film comprises one selected from a group consisting of amorphous silicon, microcrystalline silicon, amorphous germanium, microcrystalline germanium, amorphous silicon germanium ($Si_xGe_{1-x}$, 0<x<1), microcrystalline silicon germanium ($Si_xGe_{1-x}$, 0<x<1), amorphous silicon carbide, and microcrystalline silicon carbide.

5. The method according to claim 1, wherein the light absorption film is a semiconductor film.

6. The method for forming a semiconductor device according to claim 1, wherein the light absorption film comprises at least one selected from a group consisting of amorphous silicon, microcrystalline silicon, amorphous germanium, microcrystalline germanium, amorphous silicon germanium ($Si_xGe_{1-x}$, 0<x<1), and microcrystalline silicon germanium ($Si_xGe_{1-x}$, 0<x<1).

7. The method according to claim 1 further comprising, introducing an element for promoting crystallization of a semiconductor to the first semiconductor film before forming the second buffer film.

8. The method according to claim 7, wherein the element for promoting crystallization is at least one selected from a group consisting of nickel (Ni), palladium (Pd), cobalt (Co), platinum (Pt), iron (Fe), tin (Sn), lead (Pb), copper (Cu), and gold (Au).

9. The method according to claim 1, wherein the light is a laser light emitted from a continuous wave laser, a quasi-continuous-wave laser or a pulsed laser.

10. The method according to claim 1, wherein the light is a lamp light emitted from a lamp.

11. A method for forming a semiconductor device comprising:
    forming a first insulating film over a substrate;
    forming a first semiconductor film over the first insulating film;
    forming a second insulating film over the first semiconductor film;
    forming a second semiconductor film over the second insulating film; and
    irradiating the first semiconductor film with light through the second semiconductor film to form a crystalline semiconductor in the first semiconductor film by melting the first semiconductor film and the second semiconductor film.

12. The method according to claim 11, wherein the first semiconductor film has a thickness of 50 nm or smaller.

13. The method according to claim 11, wherein the second semiconductor film has a thickness of 30 to 200 nm inclusive.

14. The method according to claim 11, wherein the first semiconductor film comprises one selected from a group consisting of amorphous silicon, microcrystalline silicon, amorphous germanium, microcrystalline germanium, amorphous silicon germanium ($Si_xGe_{1-x}$, 0<x<1), microcrystalline silicon germanium ($Si_xGe_{1-x}$, 0<x<1), amorphous silicon carbide, and microcrystalline silicon carbide.

15. The method according to claim 11, wherein the second semiconductor film comprises at least one selected from a group consisting of amorphous silicon, microcrystalline silicon, amorphous germanium, microcrystalline germanium, amorphous silicon germanium ($Si_xGe_{1-x}$, 0<x<1), and microcrystalline silicon germanium ($Si_xGe_{1-x}$, 0<x<1).

16. The method according to claim 11 further comprising, introducing an element for promoting crystallization of a semiconductor to the first semiconductor film before forming the second buffer film.

17. The method according to claim 16, wherein the element for promoting crystallization is at least one selected from a group consisting of nickel (Ni), palladium (Pd), cobalt (Co), platinum (Pt), iron (Fe), tin (Sn), lead (Pb), copper (Cu), and gold (Au).

18. The method according to claim 11, wherein the light has a wavelength of 100 to 800 nm inclusive.

19. The method according to claim 11, wherein the irradiation with the light is performed using light emitted from a plurality of lasers, and
    wherein beam spots of the light overlap with each other.

20. The method according to claim 11, wherein the light is a laser light emitted from a continuous wave laser, a quasi-continuous-wave laser or a pulsed laser.

21. The method according to claim 11, wherein the light is a lamp light emitted from a lamp.

22. A method for forming a semiconductor device comprising:
    forming a first insulating film over a substrate;
    forming a first semiconductor film over the first insulating film;
    forming a second insulating film over the first semiconductor film;
    forming a second semiconductor film over the second insulating film;
    irradiating the first semiconductor film with light through the second semiconductor film to form a crystalline semiconductor in the first semiconductor film by melting the first semiconductor film and the second semiconductor film;
    removing the second semiconductor film and the second insulating film;
    patterning the first semiconductor film in which the crystalline semiconductor is formed into a predetermined form to form a crystalline semiconductor film; and
    forming an element including the crystalline semiconductor film.

23. The method according to claim 22, wherein the first semiconductor film has a thickness of 50 nm or smaller.

24. The method according to claim 22, wherein the second semiconductor film has a thickness of 30 to 200 nm inclusive.

25. The method according to claim 22, wherein the first semiconductor film comprises one selected from a group consisting of amorphous silicon, microcrystalline silicon, amorphous germanium, microcrystalline germanium, amorphous silicon germanium ($Si_xGe_{1-x}$, 0<x<1), microcrystalline silicon germanium ($Si_xGe_{1-x}$, 0<x<1), amorphous silicon carbide, and microcrystalline silicon carbide.

26. The method according to claim 22, wherein the second semiconductor film comprises at least one selected from the group consisting of amorphous silicon, microcrystalline silicon, amorphous germanium, microcrystalline germanium, amorphous silicon germanium ($Si_xGe_{1-x}$, 0<x<1), and microcrystalline silicon germanium ($Si_xGe_{1-x}$, 0<x<1).

27. The method according to claim 22 further comprising, introducing an element for promoting crystallization of a semiconductor to the first semiconductor film before forming the second buffer film.

28. The method according to claim 27, wherein the element for promoting crystallization is at least one selected from the group consisting of nickel (Ni), palladium (Pd), cobalt (Co), platinum (Pt), iron (Fe), tin (Sn), lead (Pb), copper (Cu), and gold (Au).

29. The method according to claim 22, wherein the light has a wavelength of 100 to 800 nm inclusive.

30. The method according to claim 22, wherein the irradiation with the light is performed using light emitted from a plurality of lasers, and
    wherein beam spots of the light overlap with each other.

31. The method according to claim 22, wherein the light is a laser light emitted from a continuous wave laser, a quasi-continuous-wave laser or a pulsed laser.

32. The method according to claim 22, wherein the light is a lamp light emitted from a lamp.

33. A method for forming a semiconductor device wherein:
forming a first insulating film over a substrate;
forming a first semiconductor film over the first insulating film;
forming a second insulating film over the first semiconductor film;
forming a second semiconductor film over the second insulating film;
irradiating the first semiconductor film with light through the second semiconductor film to form a crystalline semiconductor in the first semiconductor film by melting the first semiconductor film and the second semiconductor film;
removing the second semiconductor film;
patterning the second insulating film into a predetermined form to form a third insulating film;
patterning the first semiconductor film in which the crystalline semiconductor is formed into a predetermined form to form a crystalline semiconductor film; and
forming an element including the crystalline semiconductor film and the third insulating film.

34. The method according to claim 33, wherein the first semiconductor film has a thickness of 50 nm or smaller.

35. The method according to claim 33, wherein the second semiconductor film has a thickness of 30 to 200 nm inclusive.

36. The method according to claim 33, wherein the first semiconductor film comprises one selected from a group consisting of amorphous silicon, microcrystalline silicon, amorphous germanium, microcrystalline germanium, amorphous silicon germanium ($Si_xGe_{1-x}$, $0<x<1$), microcrystalline silicon germanium ($Si_xGe_{1-x}$, $0<x<1$), amorphous silicon carbide, and microcrystalline silicon carbide.

37. The method according to claim 33, wherein the second semiconductor film comprises at least one selected from a group consisting of amorphous silicon, microcrystalline silicon, amorphous germanium, microcrystalline germanium, amorphous silicon germanium ($Si_xGe_{1-x}$, $0<x<1$), and microcrystalline silicon germanium ($Si_xGe_{1-x}$, $0<x<1$).

38. The method according to claim 33 further comprising, introducing an element for promoting crystallization of a semiconductor to the first semiconductor film before forming the second buffer film.

39. The method according to claim 38, wherein the element for promoting crystallization is at least one selected from a group consisting of nickel (Ni), palladium (Pd), cobalt (Co), platinum (Pt), iron (Fe), tin (Sn), lead (Pb), copper (Cu), and gold (Au).

40. The method according to claim 33, wherein the light has a wavelength of 100 to 800 nm inclusive.

41. The method according to claim 33, wherein the irradiation with the light is performed using light emitted from a plurality of lasers, and
wherein beam spots of the light overlap with each other.

42. The method according to claim 33, wherein the light is a laser light emitted from a continuous wave laser, a quasi-continuous-wave laser or a pulsed laser.

43. The method according to claim 33, wherein the light is a lamp light emitted from a lamp.

* * * * *